United States Patent
Jindo et al.

(10) Patent No.: US 8,595,918 B2
(45) Date of Patent: Dec. 3, 2013

(54) IMAGE TAKING SYSTEM AND ELECTRONIC-CIRCUIT-COMPONENT MOUNTING MACHINE

(75) Inventors: Takahiro Jindo, Anjo (JP); Kimihiko Yasuda, Nishio (JP); Tetsunori Kawasumi, Nagoya (JP); Yasuhiro Yamashita, Toyoake (JP)

(73) Assignee: Fuji Machine Mfg. Co., Ltd., Chiryu-Shi (JP)

( * ) Notice: Subject to any disclaimer, the term of this patent is extended or adjusted under 35 U.S.C. 154(b) by 897 days.

(21) Appl. No.: 12/708,038

(22) Filed: Feb. 18, 2010

(65) Prior Publication Data
US 2010/0229377 A1  Sep. 16, 2010

(30) Foreign Application Priority Data

Mar. 10, 2009 (JP) .................. 2009-056820

(51) Int. Cl.
*H04N 5/235* (2006.01)
*H04N 5/335* (2011.01)
*H05K 13/04* (2006.01)

(52) U.S. Cl.
USPC ........... 29/709; 29/700; 29/740; 29/741; 348/362; 348/308; 348/92; 348/E5.085; 348/366; 396/93; 396/96; 396/210; 382/171; 382/173; 382/174; 382/299; 382/300

(58) Field of Classification Search
USPC ......... 29/709, 700; 348/362, 308, 92, 207.99, 348/366; 396/93, 96, 210; 382/171, 173, 382/174, 299, 300, 141, 144, 145, 147, 148, 382/151
See application file for complete search history.

(56) References Cited

U.S. PATENT DOCUMENTS 7,110,591 B2 * 9/2006 Neubauer et al. ............. 382/147

2003/0123755 A1 * 7/2003 Shimizu ...................... 382/291

(Continued)

FOREIGN PATENT DOCUMENTS

CN   1505469     6/2004
JP   A 8-154201  6/1996

(Continued)

OTHER PUBLICATIONS

Mar. 26, 2013 Office Action issued in Japanese Patent Application No. 2009-056820 (with translation).

(Continued)

*Primary Examiner* — Livius R Cazan
*Assistant Examiner* — Azm Parvez
(74) *Attorney, Agent, or Firm* — Oliff & Berridge, PLC

(57) ABSTRACT

An image taking system including: (a) a CMOS or CCD image sensor; (b) an interest-region setter configured to set regions of interest within an image taking area of the image sensor; (c) an acquiring-condition determiner configured to determine an image-data acquiring condition required for acquiring at least two image data generated in at least two of the regions of interest; and (d) an image-data acquirer configured to acquire the at least two image data. The acquiring-condition determiner includes an exposure-time determining portion configured to determine, as the image-data acquiring conditions, at least two different exposure times required for acquiring the at least two image data generated in the at least two regions of interest. The image-data acquirer includes an exposure-time-based-image-data acquiring portion configured to acquire the at least two image data, such that the acquired at least two image data are based on the at least two different exposure times. Also disclosed is an electronic-circuit-component mounting machine that includes the image taking system.

20 Claims, 15 Drawing Sheets

(56) References Cited

U.S. PATENT DOCUMENTS

2004/0150742 A1    8/2004  Ikurumi et al.
2009/0225189 A1*   9/2009  Morin .................. 348/229.1

FOREIGN PATENT DOCUMENTS

| JP | A 2003-259211 | 9/2003 |
| JP | A 2004-95812  | 3/2004 |
| JP | A-2006-74114  | 3/2006 |
| JP | A 2006-120995 | 5/2006 |
| JP | A-2008-112931 | 5/2008 |

OTHER PUBLICATIONS

Aug. 5, 2013 Notification of First Office Action issued in Chinese Patent Application No. 201010133102.2 (with translation).

* cited by examiner

| COMPONENT | ROI No. | ROI SIZE | EXPOSURE TIME | GAIN | BINNING | BRIGHTNESS | LOOKUP TABLE |
|---|---|---|---|---|---|---|---|
| 0603 RECTANGULAR CHIP RESISTOR | ROI_1 | 80×80 | 3msec | 1 | NO | 0 | NO |
| 0603 RECTANGULAR CHIP RESISTOR | ROI_2 | 80×80 | 3msec | 1 | NO | 0 | NO |
| 0603 RECTANGULAR CHIP RESISTOR | ROI_3 | 80×80 | 3msec | 1 | NO | 0 | NO |
| 0603 RECTANGULAR CHIP RESISTOR | ROI_4 | 80×80 | 3msec | 1 | NO | 0 | NO |
| 1005 RECTANGULAR CHIP RESISTOR | ROI_5 | 120×120 | 5msec | 1 | NO | 0 | NO |
| 1005 RECTANGULAR CHIP RESISTOR | ROI_6 | 120×120 | 5msec | 1 | NO | 0 | NO |
| 1005 RECTANGULAR CHIP RESISTOR | ROI_7 | 120×120 | 5msec | 1 | NO | 0 | NO |
| 1005 RECTANGULAR CHIP RESISTOR | ROI_8 | 120×120 | 5msec | 1 | NO | 0 | NO |
| 4532 RECTANGULAR CHIP CAPACITOR A | ROI_9 | 500×500 | 8msec | 1 | YES | 0 | NO |
| 4532 RECTANGULAR CHIP CAPACITOR A | ROI_10 | 500×500 | 8msec | 1 | YES | 0 | NO |
| 4532 RECTANGULAR CHIP CAPACITOR B | ROI_11 | 500×500 | 10msec | 1 | YES | 10 | NO |
| 4532 RECTANGULAR CHIP CAPACITOR B | ROI_12 | 500×500 | 10msec | 1 | YES | 10 | NO |

FIG.9

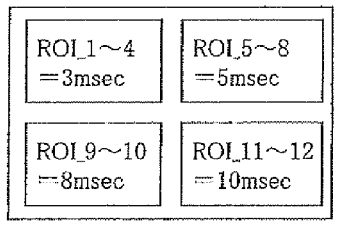
1st EXPOSURE (3msc EXPOSURE)    2nd EXPOSURE (2msc EXPOSURE)    3rd EXPOSURE (3msc EXPOSURE)
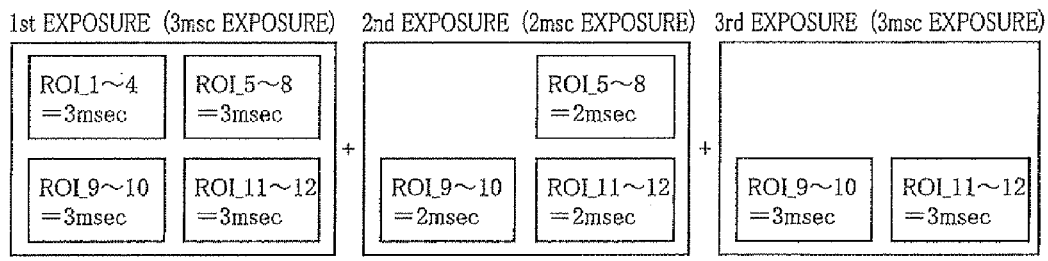
4th EXPOSURE (2msc EXPOSURE)                    ADDING OUTPUTS
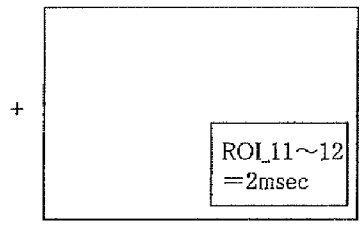        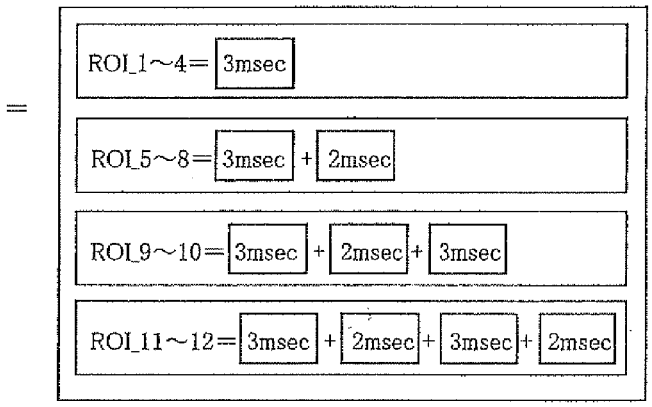
FIG.11

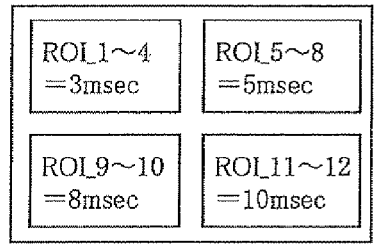
1st EXPOSURE (3msc EXPOSURE)   2nd EXPOSURE (2msc EXPOSURE)
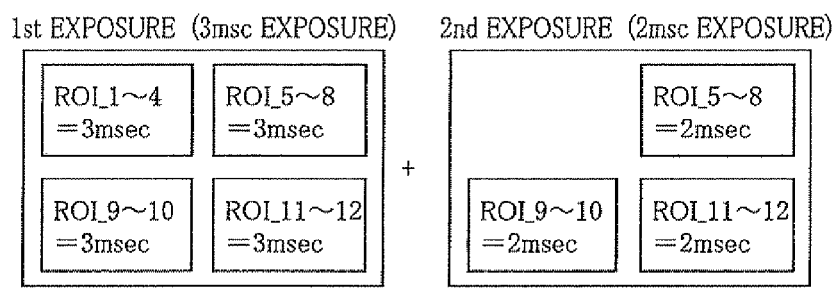
ADDING OUTPUTS
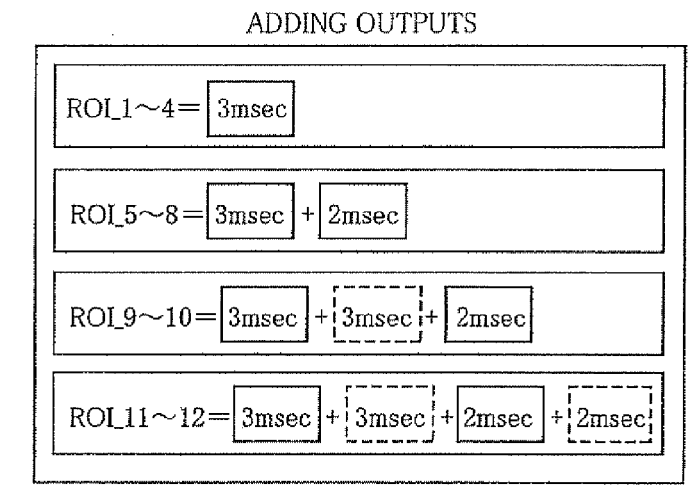
FIG.15

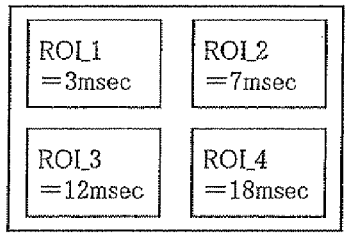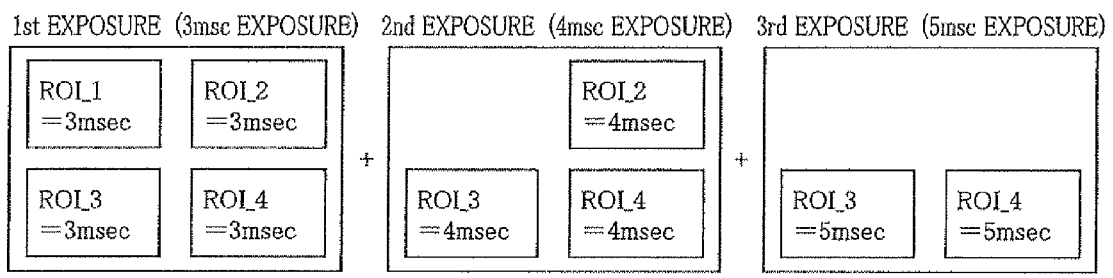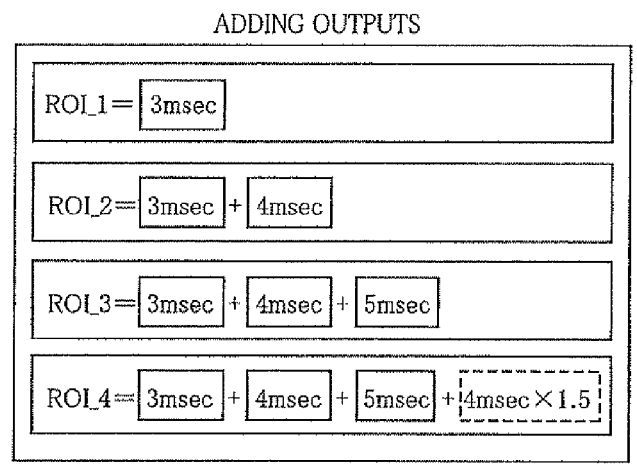
FIG.16

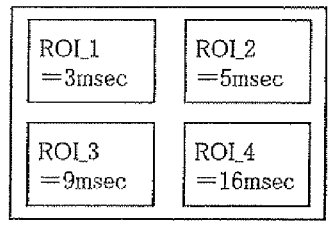
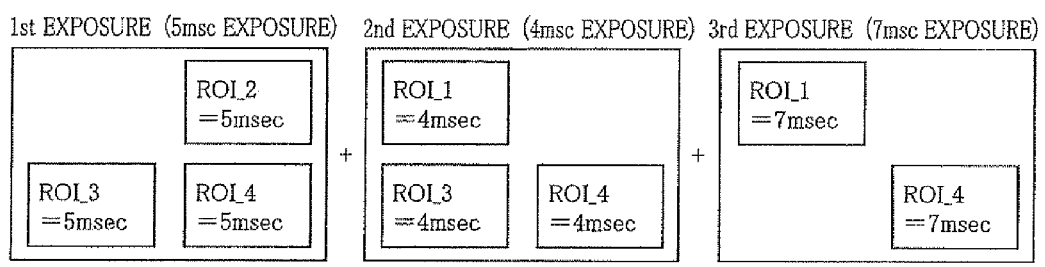
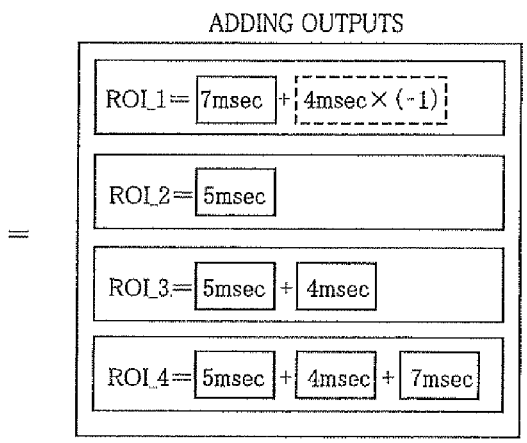
FIG.17

IMAGE TAKING SYSTEM AND ELECTRONIC-CIRCUIT-COMPONENT MOUNTING MACHINE

CROSS REFERENCE TO RELATED APPLICATION

This application claims priority from Japanese Patent Application No. 2009-056820 filed on Mar. 10, 2009, the disclosure of which is herein incorporated by reference in its entirety.

BACKGROUND OF THE INVENTION

1. Field of the Invention

The present invention relates to an image taking system including an image sensor that is configured to take an image of an object, and also to an electronic-circuit-component mounting machine including the image taking system.

2. Discussion of Related Art

There is known an image sensor including a plurality of unit cells formed in an image taking area of the sensor. Each of the unit cells is configured to perform a photoelectric conversion, namely, convert an optical image to an electric signal. JP2008-112931A discloses an image taking system including unit cells each having a CMOS image sensor that is constituted by CMOS (complementary metal oxide semiconductor). This image taking system is disposed in an electronic-circuit-component mounting machine, and is configured to take an image of an electronic circuit component (held by a suction nozzle) from under the electronic circuit component. In this image taking system, a sensitivity of a part of the image taking area is adjusted such that each of the image of the electric circuit component and its background image is taken with an even brightness. Upon adjustment of the sensitivity, the image of the electronic circuit component held by the suction nozzle is taken, and the image of the electronic circuit component and the background image are shown on a monitor display. An operator visually confirms the image of the electronic circuit component and the background image through the monitor display, and selects a region including a dark portion, i.e., a region in which the sensitivity is to be corrected. The monitor display indicates an image brightness in each unit area. When the operator selects the region in which the sensitivity is required to be adjusted, namely, in which the brightness is lower than a reference value, a sensitivity adjustment table is prepared for adjusting the sensitivity of each of unit areas included in the selected region, such that the brightness of the selected region becomes substantially equal to the reference value. When the image of the electronic circuit component is to be taken after initiation of an operation for mounting the component onto a circuit board, a sensitivity adjustment value is read from the prepared sensitivity adjustment table, and the image of the electronic circuit component is taken based on the adjusted sensitivity, by the CMOS image sensors, so that it is possible to obtain the image without any portion in which the brightness is smaller than the reference value, and accordingly to accurately obtain information such as a position of the electronic circuit component relative to the circuit board.

JP-2006-74114A discloses a digital camera including a CCD image sensor in which each unit cell is constituted by CCD (charge coupled device). In this digital camera, a plurality of ROI (regions of interest) are set within an image taking area, and an image data is subjected to predetermined processings that are performed in accordance with a desired image-quality level that is set for each of the plurality of ROI. The image data is converted through the processings, and then is shown in a display device. As the predetermined processing, for example, a filtering, a color conversion and a brightness conversion are performed. Specifically described, the filtering is performed by a filtering coefficient that varies depending on the desired image-quality level, such that a region of the image corresponding to each ROI (in which the desired image-quality level is relatively high) is made relatively clear. The color conversion and brightness conversion are performed by a color-conversion coefficient and a brightness-conversion coefficient, respectively, which vary depending on the desired image-quality level, such that the region of the image corresponding to each ROI (in which the desired image-quality level is high) is given color and brightness that are relatively close to those of an original image.

SUMMARY OF THE INVENTION

In the conventional image taking system, the quality of the taken image can be partially changed as described above. However, there is still room for improvements, for example, in the quality of image. The present invention was made in view of such a background, and an object of the invention is to provide an image taking system having a higher practicability.

The above object may be achieved by the principle of the invention, which provides an image taking system including: (a) an image sensor including a plurality of unit cells provided in an image taking area of the image sensor, each of the unit cells being configured to perform a photoelectric conversion; (b) an interest-region setter configured to set a plurality of regions of interest within the image taking area; (c) an acquiring-condition determiner configured to determine at least two image-data acquiring conditions required for acquiring respective at least two image data generated in respective at least two of the plurality of regions of interest that are set by the interest-region setter; and (d) an image-data acquirer configured to acquire the at least two image data, by the respective at least two image-data acquiring conditions that are determined by the acquiring-condition determiner, wherein the acquiring-condition determiner includes an exposure-time determining portion configured to determine, as the at least two image-data acquiring conditions, at least two exposure times required for acquiring the respective at least two image data generated in the respective at least two of the plurality of regions of interest, such that the determined at least two exposure times are different from each other, and wherein the image-data acquirer includes an exposure-time-based-image-data acquiring portion configured to acquire the at least two image data generated in the respective at least two of the plurality of regions of interest, such that the acquired at least two image data are based on the respective at least two exposure times that are different from each other.

The image sensor may be subjected to either a single exposure operation or a plurality of exposure operations that are executed, for example, in a sequential manner. Where a plurality of exposure operations are executed, the number of exposure operations to be executed may be equal to, larger than or smaller than the number of kinds of exposure times (determined by the exposure-time determining portion) which are different from each other with respect to length of time. Where the number of exposure operations to be executed is equal to the number of kinds of exposure times, each of the exposure operations may be executed for a length of time equal to a corresponding one of the exposure times determined by the exposure-time determining portion, or at least one of the exposure operations may be executed for a length of time smaller than a corresponding one of the determined exposure times.

In the image taking system according to the invention, the regions of interest are set, within the single image taking area, for a plurality of imaged subjects (whose images are to be taken) which are not the same as each other with respect to the exposure time suitable for taking the image, and then the image data representing the image of each of the imaged subjects is acquired by the exposure time determined for a corresponding one of the regions of interest. Thus, it is possible to acquire the image data representing the image of each of the imaged subjects in a state in which the image sensor is held in a certain position relative to the imaged subjects, such that the image data representing the image of each one of at least two of the imaged subjects and the image data representing the image of the other of the at least two of the imaged subjects are acquired by the respective exposure times that are different from each other, namely, such that the image data generated in each one of at least two of the plurality of regions of interest and the image data generated in the other of the at least two of the plurality of regions of interest are acquired by the respective exposure times that are different from each other.

In the following description, the "imaged subject (whose image is to be taken)" may be either an entirety or part of a single object. Where the "imaged subject" is a part of a single object, the region of interest may be set for each one of a plurality of parts that are of a single object, or may be set for each one of a plurality of parts that are of a plurality of respective objects. Further, the imaged subject will be referred to as "imaged object" where the imaged subject is an entirety of a single object, and will be referred to as "imaged part" where the imaged subject is a part of an single object.

Various Modes of the Invention

There will be described various modes of the invention (hereinafter referred to as "claimable invention" where appropriate) deemed to contain claimable features for which protection is sought. Each of these modes of the invention is numbered like the appended claims and depends from the other mode or modes, where appropriate, for easier understanding of the technical features disclosed in the present specification. It is to be understood that the present invention is not limited to the technical features or any combinations thereof which will be described, and shall be constructed in the light of the following descriptions of the various modes and preferred embodiments of the invention. It is to be further understood that a plurality of elements or features included in any one of the following modes of the invention are not necessarily provided all together, and that the invention may be embodied with selected at least one of the elements or features described with respect to the same mode. It is to be still further understood that a plurality of elements or features included in any one of the following modes of the invention may be combined with at least one additional element or feature in the light of the following descriptions of the various modes and the preferred embodiments of the invention, and that the invention may be embodied with such a possible combination with respect to the same mode.

(1) An image taking system comprising:

an image sensor including a plurality of unit cells provided in an image taking area of the image sensor, each of the unit cells being configured to perform a photoelectric conversion;

an interest-region setter configured to set at least one of region of interest within the image taking area;

an acquiring-condition determiner configured to determine at least one image-data acquiring condition required for acquiring an image data generated in each of the at least one region of interest that is set by the interest-region setter; and an image-data acquirer configured to acquire the image data, by the image-data acquiring condition that is determined by the acquiring-condition determiner.

In the present image taking system, the image data, which is generated in each of the at least one region of interest and which is acquired by the image-data acquirer, can be based on the image-data acquiring condition that is suitably determined as a condition required for acquiring the image data generated in the each of the at least one region of interest. The image sensor included in the system may be, for example, a COD image sensor in which each of the plurality of unit cells is constituted by CCD, or a CMOS image sensor that is described in the following mode (2). The region of interest may have a shape that is not particularly limited. The shape of the region of interest may be any one of various shapes such as a rectangle (e.g., parallelogram, square), a polygon, an ellipse, a circle, and any combination thereof.

By setting the at least one region of interest within the image taking area, it is possible, for example, to acquire only the image data representing only a required part or parts of an entire image that is formed on the image taking area, whereby a data amount and a data processing time can be reduced. Further, the above-described at least one region of interest may be a plurality of regions of interest such that the image-data acquiring condition for one of at least two of the plurality of regions of interest is different from the image-data acquiring condition for each of the other of the at least two of the plurality of regions of interest. This arrangement enables the single image taking area to form suitable images of a plurality of respective imaged subjects (whose images are to be taken) with the respective image-data acquiring conditions that are different from each other. Where the at least one region of interest is set in a part or parts of the image taking area (rather than in an entirety of the image taking area), the remainder of the image taking area constitutes at least one region of non-interest. The image data generated in each of the at least one region of non-interest may be either acquired or not acquired. Where the at least one region of non-interest consists of a plurality of regions of non-interest and the image data generated in each of the plurality of regions of non-interest are intended to be acquired, all the image data generated in the plurality of regions of non-interest may be acquired by the same image-data acquiring condition that is determined commonly to all of the plurality of regions of non-interest.

(2) The image taking system according to mode (1), wherein the image sensor is a CMOS image sensor including complementary metal oxide semiconductors that constitute the unit cells.

The CMOS requires an electric voltage lower than that required by the CCD, and consumes an electric power smaller than that consumed by the CCD. Further, the CMOS is less expensive than the CCD. In the CMOS image sensor, it is possible to select one or ones of the plurality of unit cells (that cooperate with each other to constitute the image taking area), by specifying its or their set of values in coordinates, so as to activate the selected one or ones of the unit cells. That is, by activating the selected one or ones of the unit cells, it is possible to easily set a region or regions of interest having a desired shape and size within the image taking area, and to easily acquire the image data originating from the region or regions of interest by the image-data acquiring condition or conditions determined for the same region or regions of interest.

(3) The image taking system according to mode (1) or (2), wherein the interest-region setter is configured to set a plurality of regions of interest as the at least one region of interest, wherein the acquiring-condition determiner is configured to determine, as the at least one image-data acquiring condition, at least two image-data acquiring conditions required for acquiring respective at least two image data generated in respective at least two of the plurality of regions of interest that are set by the interest-region setter, wherein the acquiring-condition determiner includes an exposure-time determining portion configured to determine, as the at least two image-data acquiring conditions, at least two exposure times required for acquiring the respective at least two image data generated in the respective at least two of the plurality of regions of interest, such that the determined at least two exposure times are different from each other, and wherein the image-data acquirer includes an exposure-time-based-image-data acquiring portion configured to acquire the at least two image data generated in the respective at least two of the plurality of regions of interest, such that the acquired at least two image data are based on the respective at least two exposure times that are different from each other.

In the image taking system according to this mode (3), the plurality of regions of interest are set within the image taking area, and the determined exposure time (as an example of the image-data acquiring condition) required for acquiring the image data generated in each one of the at least two of the plurality of regions of interest is different from the determined exposure time required for acquiring the image data generated in each of the other of the at least two of the plurality of regions of interest, for thereby making it possible to acquire the image data generated in each of the at least two of the plurality of regions of interest, based on a suitable exposure time that could vary depending upon which one of the at least two of the plurality of regions of interest the image data in question originates from. It is noted that the feature that "the acquired at least two image data are based on the respective at least two exposure times" may be interpreted that "each of the acquired at least two image data is based on a resultant output which is generable as a result of execution of an exposure operation for a length of time that is equal to a corresponding one of the at least two exposure times".

(4) The image taking system according to mode (3), wherein the exposure-time-based-image-data acquiring portion of the image-data acquirer includes:

a plural-exposure-operations executing portion configured to execute a plurality of exposure operations for the image sensor, for thereby causing, as an image data which consists of each of the at least two image data, resultant outputs to be generated in a corresponding one of the at least two of the plurality of regions of interest as results of executions of the plurality of exposure operations; and an output-adding-operation executing portion configured to execute an output adding operation for adding the resultant outputs generated in each of the at least two of the plurality of regions of interest as results of executions of the plurality of exposure operations, such that the acquired image data that is generated in each of the at least two of the plurality of regions of interest is based on the added resultant outputs that correspond to a corresponding one of the at least two exposure times, and wherein the output-adding-operation executing portion configured to execute the output adding operation for adding the resultant outputs generated in each of the at least two of the plurality of regions of interest, such that the resultant outputs generated in each one of the at least two of the plurality of regions of interest are added to each other in a manner different from a manner in which the resultant outputs generated in the other of the at least two of the plurality of regions of interest are added to each other, whereby the acquired at least two image data are based on the respective at least two exposure times that are different from each other.

The plurality of regions of interest may be regions into which the entirety of the image taking area is divided, or may be regions set in respective parts of the image taking area which are different from each other. In the former case, there is not exist any region of non-interest within the image taking area. In the latter case, a part or parts of the image taking area, which are not included in any one of the plurality of regions of interest, constitute the region or regions of non-interest.

The above-described feature that "the resultant outputs generated in each one of the at least two of the plurality of regions of interest are added to each other in a manner different from a manner in which the resultant outputs generated in the other of the at least two of the plurality of regions of interest are added to each other" encompasses an arrangement in which the resultant outputs generated in each one of the at least two of the plurality of regions of interest are added to each other while the resultant outputs generated in the other of the at least two of the plurality of regions of interest are not substantially added to each other. As such an encompassed arrangement, for example, there is an arrangement in which all the resultant outputs (generated as results of executions of the respective exposure operations) are added to each other in the output adding operation for at least one of the at least two of the plurality of regions of interest while the resultant outputs (generated as results of executions of the respective exposure operations) other than at least one thereof are added to each other in the output adding operation for the other of the at least two of the plurality of regions of interest. That is, in this arrangement, all the resultant outputs are added to each other in the former adding operation while all the resultant outputs are not added to each other in the latter adding operation. This arrangement can be categorized into two cases: (a) the above-described at least one resultant output is not added to the other, since the at least one resultant output is not available in the output-adding-operation executing portion, for example, due to absence of supply of the at least one resultant output to the output-adding-operation executing portion; and (b) the above-described at least one resultant output is not added to the other although the at least one resultant output is available in the output-adding-operation executing portion.

For taking the image of a subject, the image taking area does not necessarily have to be subjected to an exposure operation continuously for a length of time equal to the exposure time (determined by the exposure-time determining portion) for acquiring the image data generated in the region of interest corresponding to the subject, but may be subjected to an exposure operation executed in an intermittent manner or a plurality of exposure operations executed, for example, in a sequential manner. That is, the image taking area may be subjected to a plurality of exposure operations executed for respective lengths of time into which the determined exposure time is divided, so that the image data based on the determined exposure time can be acquired, by adding the resultant outputs generated as results of executions of the respective exposure operations.

In the image taking system according to this mode (4), the resultant outputs generated in each one of the at least two regions of interest are added to each other in a manner different from a manner in which the resultant outputs generated in the other of the at least two regions of interest are added to each other, whereby the acquired image data that originates from each one of the at least two of the plurality of regions of interest is based on the exposure time that is different from the exposure time, based on which the acquired image data that originates from the other of the at least two of the plurality of regions of interest is. Further, at least one of the plurality of exposure operations may be executed commonly for at least two of the plurality of regions of interest, so that a sum of lengths of time of the respective exposure operations can be made smaller than in an arrangement in which the plurality of exposure operations are executed for the respective regions of interest for respective lengths of time equal to the respective exposure times. It is therefore possible to reduce a total length of time required for taking the image.

The output adding operation is not necessarily performed by simply adding the resultant outputs generated as results of executions of the respective exposure operations. For example, in the output adding operation, each of at least one of the resultant outputs generated as a result of execution of a corresponding one of the plurality of exposure operations may be added a plurality of times. By thus adding each of the at least one of the resultant outputs (generated by execution of the corresponding exposure operation) twice or more, it is possible to reduce a total length of time required for taking the image. However, even where two or more of the plurality of exposure operations are to be executed for the same length of time, namely, even where the number of executions of the plurality of exposure operations can be reduced by adding the same resultant output (generated by execution of one of the two or more of the plurality of exposure operations) twice or more times, there is a case in which it is preferable to actually execute the two or more exposure operations and to add the resultant outputs actually generated by executions of the respective two or more exposure operations, rather than to execute only one of the two or more exposure operations and to add the same resultant output (generated by execution of the one exposure operation) twice or more times. This is because, where the resultant output generated by execution of the one exposure operation is added twice or more times, noise randomly generated in the same resultant output is inevitably doubled or more, so that the acquired image data would be considerably affected by the noise if the noise is generated by a large amount in the resultant output that is added twice or more times. On the other hand, where the resultant outputs generated by executions of the respective two or more exposure operations are added to each other, it is possible to reduce such a risk that the acquired image data would be considerably affected by the noise.

(5) The image taking system according to mode (4), wherein the output-adding-operation executing portion is configured to obtain, as the added resultant outputs, a sum of products of the resultant outputs and respective coefficients, by executing the output adding operation, such that at least one of the resultant outputs, which is generated in each one of the at least two of the plurality of regions of interest as a result of execution of a corresponding at least one of the plurality of exposure operations, and at least one of the resultant outputs, which is generated in the other of the at least two of the plurality of regions of interest as a result of execution of the corresponding at least one of the plurality of exposure operations, are multiplied by the respective coefficients that are different from each other.

In the image taking system according to this mode (5), the output adding operation is executed to obtain, as the exposure time, the sum of products of the resultant outputs and respective coefficients, such that the output adding operation for each one of the at least two regions of interest and the output adding operation for the other of the at least two regions of interest are different from each other with respect to at least one of the coefficients by which a corresponding at least one of the resultant outputs is multiplied, whereby the acquired image data that originates from each one of the at least two regions of interest is based on the sum that is different from the sum, based on which the acquired image data that originates from the other of the at least two regions of interest is. It is noted that each of the coefficients by which a corresponding one of the resultant outputs is multiplied does not necessarily have to be one but may be any positive value, any negative value or even zero. That is, the above-described sum is not necessarily equal to a sum of the resultant outputs generated as results of executions of the plurality of exposure operations. It is further noted that, in output adding operation, the sum may be obtained either by multiplying resultant outputs by respective coefficients and then adding the products to each other or by adding the resultant outputs to each other and then multiplying the sum of the resultant outputs by a coefficient.

Where each of the coefficients is one, the above-described sum (hereinafter referred to as "product sum") of products of the resultant outputs and respective coefficients is equal to the sum (hereinafter referred to as "output sum") of the generated resultant outputs. Where at least one of the coefficients is a positive value smaller or larger than one, it is possible to obtain the product sum that is smaller or larger than the output sum, and accordingly to acquire the image data as if the acquired image data were generated by executions of the exposure operations for a total length of time that is smaller or larger than actually is. Where at least one of the coefficients is a positive value, the positive value may be two or a value larger than two, so that it is possible to acquire the image data as if the acquired image data were generated by executions of the exposure operations whose number is larger than actually is. Thus, by setting at least one of the coefficients to two or a value larger than two, the acquired image data that originates from each of the regions of interest can be based on the determined exposure time, even with reduction of the number of the executed exposure operations and/or reduction of a length of time of each of the executed exposure operations. Where at least one of the coefficient is a negative value, it is possible to interpret that the output-adding-operation executing portion includes an output-subtracting-operation executing portion that is configured to add at least one product of the resultant output and the negative coefficient. Where at least one of the coefficients is zero, a corresponding one or ones of the resultant outputs are not substantially added to the other, so that it is possible to acquire the image data as if the acquired image data were generated by executions of the exposure operations whose number is smaller than actually is. The above-described feature that "the resultant outputs generated in each one of the at least two of the plurality of regions of interest are added to each other in a manner different from a manner in which the resultant outputs generated in the other of the at least two of the plurality of regions of interest are added to each other" encompasses an arrangement in which the output adding operation for each one of the at least two regions of interest and the output adding operation for the other of the at least two regions of interest are different from each other with respect to the number of the at least one of the coefficients that is set to zero.

(6) The image taking system according to mode (5), wherein the output-adding-operation executing portion is configured to obtain the sum of the products of the resultant outputs and the respective coefficients, such that each of at least one of the resultant outputs generated in at least one of the at least two of the plurality of regions of interest is multiplied by a corresponding one of the coefficients which is other than one.

(7) The image taking system according to mode (5), wherein the output-adding-operation executing portion is configured to obtain the sum of the products of the resultant outputs and the respective coefficients, such that each of at least one of the resultant outputs generated in at least one of the at least two of the plurality of regions of interest is multiplied by a corresponding one of the coefficients which is other than one and other than zero.

(8) The image taking system according to any one of modes (4)-(7), wherein the output-adding-operation executing portion is configured to execute the output adding operation for adding the resultant outputs generated in each of the at least two of the plurality of regions of interest, after each of the resultant outputs generated in the each of the at least two of the plurality of regions of interest has been converted into a gradation value.

In the image taking system according to this mode (8), the output adding operation is executed in a computer that is incorporated in the image taking system.

(9) The image taking system according to any one of modes (4)-(8), wherein the output-adding-operation executing portion is configured to execute the output adding operation for adding the resultant outputs generated in each of the plurality of regions of interest, before each of the resultant outputs generated in the each of the plurality of regions of interest is converted into a gradation value.

In the image taking system according to this mode (9), the output adding operation is executed in an electronic circuit. For example, the output generated by execution of each exposure operation is integrated in the image sensor.

(10) The image taking system according to any one of modes (3)-(9),
wherein the exposure-time-based-image data acquiring portion of the image-data acquirer includes:
a plural-exposure-operations executing portion configured to execute a plurality of exposure operations for the image sensor, for thereby causing, as an image data which consists of each of the at least two image data, resultant outputs to be generated in a corresponding one of the at least two of the plurality of regions of interest as results of executions of the plurality of exposure operations;
an output receiving portion configured to receive at least one of the resultant outputs supplied from each of the at least two of the plurality of regions of interest, whereby the acquired image data that is generated in each of the at least two of the plurality of regions of interest is based on a corresponding one of the at least two exposure times which is based on a sum of the at least one of the resultant outputs supplied from the each of the at least two of the plurality of regions of interest; and
an output supply controlling portion configured to control supply of the resultant outputs from each of the at least two of the plurality of regions of interest, such that at least one of the resultant outputs, which is generated in at least one of the at least two of the plurality of regions of interest as a result of execution of a corresponding at least one of the plurality of exposure operations, is supplied to the output receiving portion, without supply of at least one of the resultant outputs, which is generated in the other of the at least two of the plurality of regions of interest as a result of execution of the corresponding at least one of the plurality of exposure operations, to the output receiving portion.

In the image taking system according to this mode (10), the resultant output or outputs generated in at least one of the at least two regions of interest by execution of at least one of the exposure operations is supplied to the output receiving portion, while the resultant output or outputs generated in the other of the at least two regions of interest by execution of the same exposure operation or operations (i.e., the above-described at least one of the exposure operations) is not supplied to the output receiving portion, whereby a total amount of the resultant output or outputs supplied from the above-described at least one of the at least two regions of interest to the output receiving portion can be made different from a total amount of the resultant output or outputs supplied from the above-described other of the at least two regions of interest to the output receiving portion, so that the acquired image data that is generated in each one of the at least two regions of interest is based on the exposure time that can be different from the exposure time, based on which the acquired image data that is generated in the other of the at least two regions of interest is.

(11) The image taking system according to any one of modes (3)-(10,
wherein the exposure-time-based-image-data acquiring portion of the image-data acquirer includes:
a plural-exposure-operations executing portion configured to execute a plurality of exposure operations for the image sensor, for thereby causing, as an image data which consists of each of the at least two image data, resultant outputs to be generated in a corresponding one of the at least two of the plurality of regions of interest as results of executions of the plurality of exposure operations;
an output receiving portion configured to receive at least one of the resultant outputs supplied from each of the at least two of the plurality of regions of interest, whereby the acquired image data that is generated in each of the at least two of the plurality of regions of interest is based on a corresponding one of the at least two exposure times which is based on a sum of the at least one of the resultant outputs supplied from the each of the at least two of the plurality of regions of interest; and
an output supply controlling portion configured to control supply of the resultant outputs from each of the at least two of the plurality of regions of interest, such that at least one of the resultant outputs, which is generated in at least one of the at least two of the plurality of regions of interest as a result of execution of a corresponding at least one of the plurality of exposure operations, is supplied to the output receiving portion, together with supply of at least one of the resultant outputs, which is generated in the other of the at least two of the plurality of regions of interest as a result of execution of the corresponding at least one of the plurality of exposure operations, to the output receiving portion.

In the image taking system according to this mode (11), the resultant output or outputs generated in at least one of the at least two regions of interest by execution of at least one of the exposure operations is supplied to the output receiving portion, and the resultant output or outputs generated in the other of the at least two regions of interest by execution of the same exposure operation or operations (i.e., the above-described at least one of the exposure operations) is also supplied to the output receiving portion, whereby a total length of time required for the output receiving portion to receive the at least one of the resultant outputs supplied from the at least one of the at least two interest and the at least one of the resultant outputs supplied from the other of the at least two regions of interest can be made smaller than an arrangement in which the at least one of the resultant outputs which is generated in the at least one of the at least two regions of interest as a result of execution of the corresponding at least one of the plurality of exposure operations, is supplied to the output receiving portion, without supply of the at least one of the resultant outputs, which is generated in the other of the at least two regions of interest as a result of execution of the corresponding at least one of the plurality of exposure operations, to the output receiving portion.

(12) The image taking system according to any one of modes (4)-(11), wherein the plural-exposure-operations executing portion of the exposure-time-based-image-data acquiring portion of the image-data acquirer is configured to execute the plurality of exposure operations such that at least two of the plurality of exposure operations are executed for respective lengths of time which are different from each other.

The plurality of exposure operations may be executed for respective lengths of time which are equal to each other. However, in general, a required number of the exposure operations can be made smaller where at least two of the plurality of exposure operations are executed for respective different lengths of time, as in the image taking system according to this mode (12), than where all the exposure operations are executed for the same length of time.

(13) The image taking system according to any one of modes (4)-(12), wherein the plural-exposure-operations executing portion of the exposure-time-based-image-data acquiring portion of the image-data acquirer is configured to execute at least two exposure operations as the plurality of exposure operations, such that one of the at least two exposure operations is executed for a length of time equal to a smallest one of the at least two different exposure times, and such that each of the other of the at least two exposure operations is executed for a length of time equal to a difference between a corresponding pair of the at least two different exposure times, the corresponding pair of the at least two different exposure times being adjacent to each other where the at least two different exposure times are arranged in order of length thereof.

This arrangement is effective to reduce a required number of the exposure operations, particularly, where the above-described product sum is equal to the above-described output sum.

(14) An image taking system for taking an image of each of at least one subject, the system comprising:

an image sensor including a plurality of unit cells provided in an image taking area of the image sensor, each of the unit cells being configured to perform a photoelectric conversion;

an interest-region setter configured to set a plurality of regions of interest within the image taking area such that each of the plurality of regions of interest corresponds to a selected region of the image;

an acquiring-condition determiner configured to determine an image-data acquiring condition for acquiring an image data representing the selected region of the image; and an image-data acquirer configured to acquire the image data, by the image-data acquiring condition that is determined by the acquiring-condition determiner.

It is possible to employ technical feature described in any one of the above modes (2)-(13), in the image taking system according to this mode (14).

(15) An electronic-circuit-component mounting machine comprising:

a board holder configured to hold a circuit board;

a component mounter configured to mount a plurality of electronic circuit components onto the circuit board that is held by the board holder;

a component supplier configured to supply the electronic circuit components to the component mounter, whereby each of the electronic circuit components is received by a component holder of the component mounter;

a component-image taking system configured to take an image of each of the electronic circuit components which is held by the component holder; and a component mounting controller configured to detect a positional error of each of the electronic circuit components which is held by the component holder, based on the image taken by the component-image taking system, and to control the component mounter such that each of the electronic circuit components is mounted onto the circuit board with the positional error being at least reduced.

In the component mounting machine according to this mode (15), owing to reduction of the positional error of each of the electronic circuit components held by the respective component holders, namely, owing to reduction of deviation of actual position and attitude of each component from desired position and attitude of the component when the component is being held by the component holder, it is possible to mount the component onto the circuit board with improved accuracy of position and attitude of the component relative to the circuit board. It is noted that the component-image taking system may be configured to take either an image of entirety of the component or an image of each of at least one part of the component. Where the image of entirety of the component is taken, the component constitutes an imaged object. Where the image of each of at least one part of the component is taken, each of the at least one part of the component constitutes an imaged part. In the following description, the term "taking the image of the electronic circuit component" may be interpreted as a generic term encompassing "taking the image of entirety of the electronic circuit component" and also "taking the image of each of at least one part of the electronic circuit component", unless otherwise specified.

(16) The electronic-circuit-component mounting machine according to mode (15), further comprising:

an information storage configured to store therein an image-taking-related information that is required to take the image of each of the electronic circuit components such that the stored image-taking-related information is associated with the each of the electronic circuit components, and wherein the image taking system is configured to take the image of each of the electronic circuit components, in accordance with the image-taking-related information which is stored in the information storage and which is associated with the each of the electronic circuit components.

The image-taking-related information may contains various data such as interest-region setting data (as described below), image-data acquiring condition data (as described below) and data indicative of whether a front image or a silhouette image of the electronic circuit component is to be taken. In the information storage, there may be stored at least one of these various data as example of the image-taking-related information. The technical features provided by the component mounting machine according to this mode (16) is enjoyable particularly where the electronic circuit component (to be handled by the machine) are of various kinds, because the image-taking-related information may be variable depending on the kind of each component so that the image of each component can be taken by a condition suitable for property of the kind of each component.

(17) The electronic-circuit-component mounting machine according to mode (16), wherein the information storage is configured to store therein, in addition to the image-taking-related information, a component-mounting-related information that is required to mount each of the electronic circuit components onto the circuit board such that the component-mounting-related in formation as well as the image-taking-related information is associated with the each of the electronic circuit components, and wherein the component mounting controller is configured to control the component mounter such that the each of the electronic circuit components is mounted onto the circuit board, in accordance with the component-mounting-related information which is stored in the information storage and which is associated with the each of the electronic circuit components.

Since the image of the electronic circuit component is taken when the component is about to be mounted onto the circuit board, namely, since taking the image of component and mounting the component onto the circuit board are carried out as a series of operations, the image-taking-related information and the component-mounting-related information can be used more easily where the image-taking-related information and the component-mounting-related information are stored in association with each of the electronic circuit components, as in the component mounting machine according to this mode (17).

(18) The electronic-circuit-component mounting machine according to mode (15), wherein the component-image taking system is provided by the component-image taking system that is recited in any one of modes (1)-(14).

In the component mounting machine according to this mode (18), the region of interest can be set in a part of the image taking area in which the image of the electronic circuit component is to be formed, and the image data representing the image of the component can acquired by the image-data acquiring condition that is determined for the region of interest. This arrangement makes it possible to reduce a length of time required for processing the image data and/or to obtain the image of the component having a high degree of accuracy.

(19) The electronic-circuit-component mounting machine according to mode (16) or (17), wherein the component-image taking system is provided by the component-image taking system that is recited in any one of modes (1)-(14).

(20) The electronic-circuit-component mounting machine according to mode (19), wherein each of at least one of the interest-region setter and the acquiring-condition determiner includes an image-taking-related-information-based executing portion that is configured to execute a corresponding one of setting of the plurality of regions of interest and determination of the image-data acquiring condition, based on the image-taking-related information that is stored in the information storage.

In the component mounting machine according to this mode (20), the information storage stores therein, as the image-taking-related information, an information based on which each of at least one of the interest-region setter and the acquiring-condition determiner executes a corresponding one of setting of the plurality of regions of interest and determination of the image-data acquiring condition. Although at least one of the setting of the region of interest and the determination of the image-data acquiring condition can be executed based on data inputted manually by an operator through a data input device, such a manual operation requires a relatively large length of time and cumbersome to the operator. In the machine according to this mode (20), at least one of the setting of the region of interest and the determination of the image-data acquiring condition is executed based on the image-taking-related information that is read out from the information storage. Since the image-taking-related information is associated with each of the electronic circuit components, the more a technical feature provided by the machine according to this mode (20) is enjoyable, the more the kinds of electronic circuit component are to be imaged.

(21) The electronic-circuit-component mounting machine according to mode (20), wherein the information storage is configured to store therein the image-taking-related information such that the stored image-taking-related information includes an interest-region setting data that is required for setting the plurality of regions of interest within the image taking area.

In the machine according to this mode (21), the interest-region setting data as such is stored in the information storage, so that the interest-region setter is configured to set each of the plurality of regions of interest in accordance with the interest-region setting data that is read out from the information storage.

(22) The electronic-circuit-component mounting machine according to mode (20) or (21), wherein the information storage is configured to store therein the image-taking-related information such that the stored image-taking-related information includes an image-data acquiring condition data representing the at least two image-data acquiring conditions for acquiring the at least two image data generated in the respective at least two of the plurality of regions of interest.

In the machine according to this mode (22), the image-data acquiring condition data as such is stored in the information storage, so that the acquiring-condition determiner is configured to determine the image-data acquiring condition in accordance with the image-data acquiring condition data that is read out from the information storage.

(23) The electronic-circuit-component mounting machine according to any one of modes (15)-(22), wherein the component-image taking system is provided by the image taking system that is recited in any one of modes (1)-(14), wherein the component mounter includes (i) a mounting head having a plurality of component-holder holding portions each of which is configured to hold the component holder, and (ii) a head moving device configured to move the mounting head such that the mounting head is positionable in any desired position within a movement area between the component supplier and the board holder, wherein the image taking area of the image sensor has a size that enables images of the plurality of electronic circuit components each of which is held by the component holder, to be formed, together with each other, on the image taking area, upon light reception by each of the unit cells provided in the image taking area, and wherein the interest-region setter is configured to set, as the plurality of regions of interest, a plurality of corresponding regions of the image taking area which correspond to respective electronic circuit components cooperating with each other to constitute at least a part of the plurality of electronic circuit components each of which is held by the component holder.

In the mounting machine according to this mode (23), the mounting head may be either a rotary-type mounting head and a non-rotary-type mounting head. Where the mounting head is the rotary-type mounting head having a rotary body rotatable about its axis, the above-described plurality of component-holder holding portions may be located in respective positions lying on a circle whose center is aligned with the axis of the rotary body. Where the mounting head is the non-rotary-type mounting head, the above-described plurality of component-holder holding portions may be located in respective positions arranged in a straight line.

Where the plurality of electronic circuit components, whose images are to be formed together with each other on the image taking area, are of various kinds, the image-data acquiring conditions required for the respective kinds of components could be different from each other, since each image-data acquiring condition could vary depending on, for example, size, shape, material and color of the corresponding kind of electronic circuit component. However, in the present mounting machine, even in such a case, the image of each component can be obtained with a high quality through the image data that is acquired by the image-data acquiring condition suitable for the component in question, whereby the positional error of the component held by the component holder can be detected with an improved accuracy.

Where this mode (23) is carried out together with feature of the above mode (16), the feature that the image-taking-related information is stored in the information storage is effectively enjoyable, particularly, in a case in which the plurality of electronic circuit components are of various many kinds, because the regions of interest can be quickly set by reading out the image-taking-related information (that serves for each kind of component) from the information storage.

Where the mounting head is of rotary type, each electronic circuit component held by the component holder is given an attitude that is changed depending on an angular position of the component, namely, changed with rotation of the mounting head. Where each of the region of interest has a rectangular shape, each region of interest may be set within the image taking area, such that mutually perpendicular sides of each rectangular region of interest are in parallel to respective X-axis and Y-axis of XY-coordinate plane in the component mounting machine, or such that one of the sides of each rectangular region of interest is in perpendicular to a line interconnecting a center of the rectangular region of interest and a center of the image taking area which is aligned with the rotation axis of the rotary body while the other side is in parallel to the same line. In the latter case, an amount of inclination of each side of the rectangular region of interest with respect to a corresponding one of the X-axis and Y-axis of the XY-coordinate plane varies depending on the angular position of the corresponding component.

From point of view of reduction of a length of time required for the data processing, it is preferable that the regions of interest are set for all the electronic components whose images are formed together with each other on the image taking area. However, this is not essential. For example, the region or regions of interest may be set exclusively for one or ones of the components, which should be different from the other components with respect to the image-data acquiring condition.

BRIEF DESCRIPTION OF THE DRAWINGS

The above and other objects, features, advantages and technical and industrial significance of the present invention will be better understood by reading the following detailed description of presently preferred embodiments of the invention, when considered in connection with the accompanying drawings, in which:

FIG. 9 is a table showing the above-described image-taking-related information by way of example;

FIG. 11 is a set of views for explaining exposure operations and output adding operations, which are executed in accordance with the image-taking-related information shown in FIG. 9;

FIG. 15 is a set of views for explaining exposure operations and output adding operations, which are executed in another embodiment;

FIG. 16 is a set of views for explaining exposure operations and output adding operations, which are executed in still another embodiment; and FIG. 17 is a set of views for explaining exposure operations and output adding operations, which are executed in still another embodiment.

DETAILED DESCRIPTION OF THE PREFERRED EMBODIMENT

There will be described embodiments of the present invention, by reference to the accompanying drawings. It is to be understood that the present invention is not limited to the embodiments, and may be otherwise embodied with various changes and modifications, such as those described in the foregoing "VARIOUS MODES OF THE INVENTION", which may occur to those skilled in the art.

Figure 1:
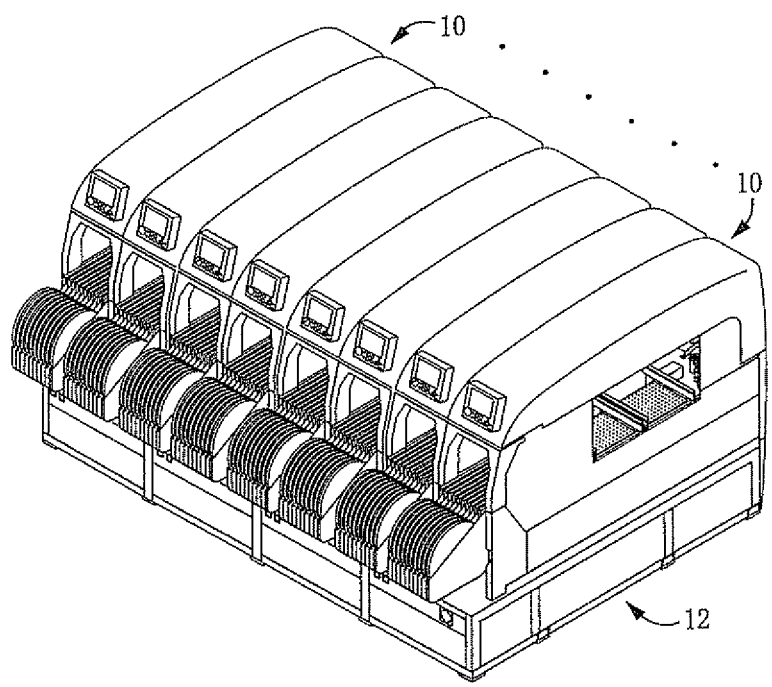
FIG. 1 is a perspective view showing an electronic-circuit-component mounting system including a plurality of mounting modules each of which is constructed according to an embodiment of the invention.

FIG. 1 shows an appearance of an electronic-circuit-component mounting system. This mounting system includes a plurality of mounting modules 10 and a base 12 that is common to the mounting modules 10. The mounting modules 10 are fixed to the common base 12, such that the modules 10 are positioned adjacent to each other and arranged in a single row. Each of the mounting modules 10 is an electronic-circuit-component mounting machine constructed according to an embodiment of the claimable invention. The mounting modules 10 are operated concurrently with each other so as to share an operation for mounting electronic circuit components onto a circuit board.

Figure 2:
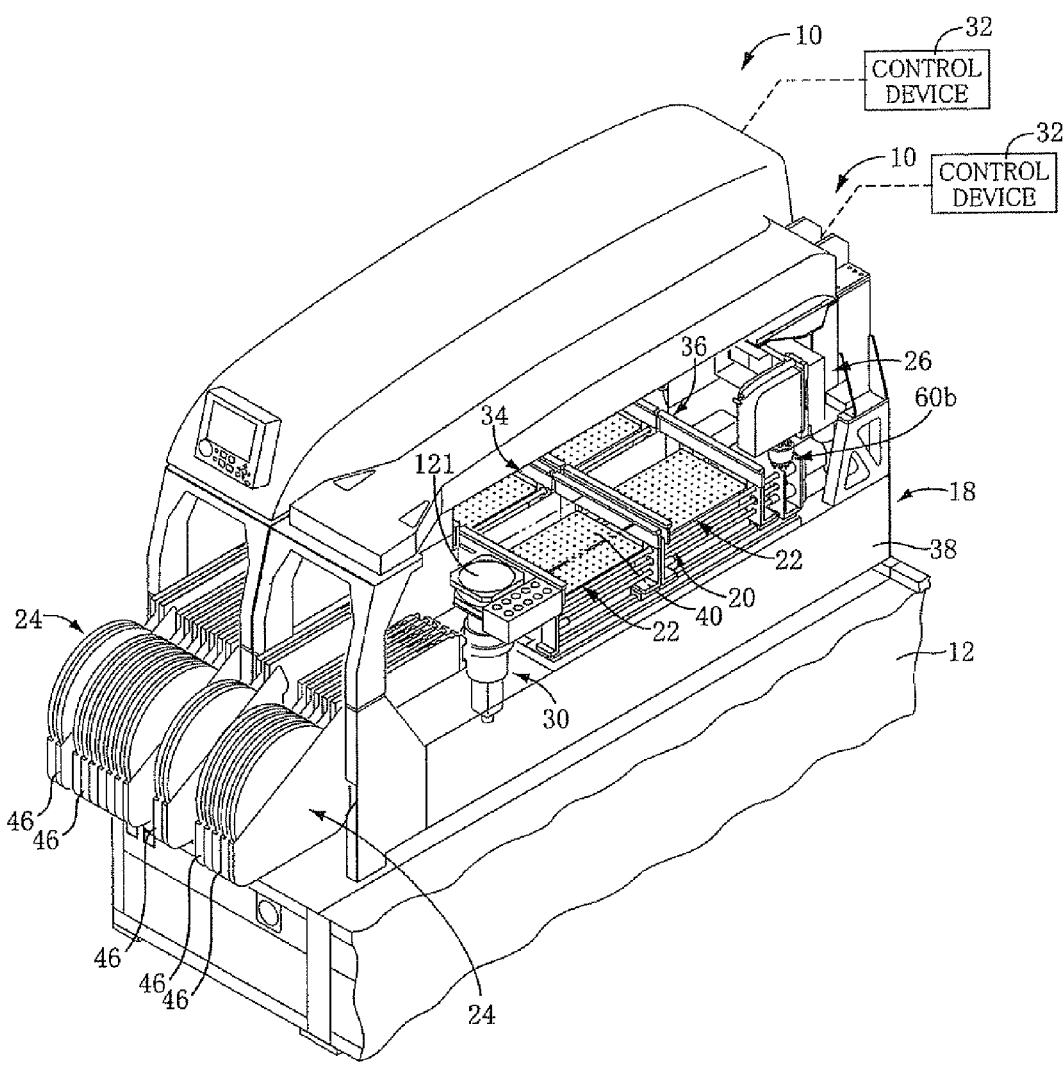
FIG. 2 is a perspective view showing a board conveying device and other devices as a part of the above-described mounting module.

Since the mounting modules 10 are described in detail, for example, in JP-2004-104075A, redundant description of their elements not relevant to the claimable invention will not be provided. As shown in FIG. 2, each of the mounting modules 10 includes a module body 18, a board conveying device 20, two board holders 22, a component supplier 24, a component mounter 26, a fiducial-mark-image taking device 28 (see FIG. 3), a component-image taking system 30 constructed according to an embodiment of the claimable invention, and a control device 32.

As shown in FIG. 2, the board conveying device 20 has two board conveyors 34, 36, and is disposed in a central portion of a base portion 38 (that constitutes the module body 18) in a longitudinal direction of the mounting module 10. The board conveying device 20 is configured to convey circuit boards 40 in a conveying direction, i.e., a horizontal direction that is parallel to a direction in which the mounting modules 10 are arranged. Each of the two board holders 22 is provided in a corresponding one of the two board conveyors 34,36, and has a support member (not shown) configured to support the circuit boards 40 from under the boards 40 and a clamp member (not shown) configured to clamp opposite end portions of each board 40 which extend in the above-described conveying direction. Each board holder 22 holds each board 40 such that its mounted surface (onto which the electronic circuit component are to be mounted) is held horizontal. In the following description, the conveying direction will be referred to as X-axis direction, and a direction which is parallel to the mounted surface of the circuit board 40 held by the board holder 22 and is perpendicular to the X-axis direction in a horizontal plane will be referred to as Y-axis direction.

As shown in FIG. 2, the component supplier 24 is disposed on one of opposite sides of the board conveying device 20 in the Y-axis direction, namely, disposed in a front portion of the mounting module 10. The component supplier 24 includes, for example, a plurality of tape feeders 46 as an example of a component feeder and a feeder support base (not shown) to which the feeders 46 are attached. The component supplier 24 is operable to supply the electronic circuit components by the feeders 46. Each of the feeders 46 is configured to supply the multiplicity of electronic circuit components which are held by a tape. The feeders 46 holds respective different kinds of electronic circuit components, and have respective component supplying portions which are arranged in the X-axis direction and which are attached to the feeder support base. It is noted that the component supplier 24 may be replaced by a device configured to supply the electronic circuit components by trays.

Figure 3:
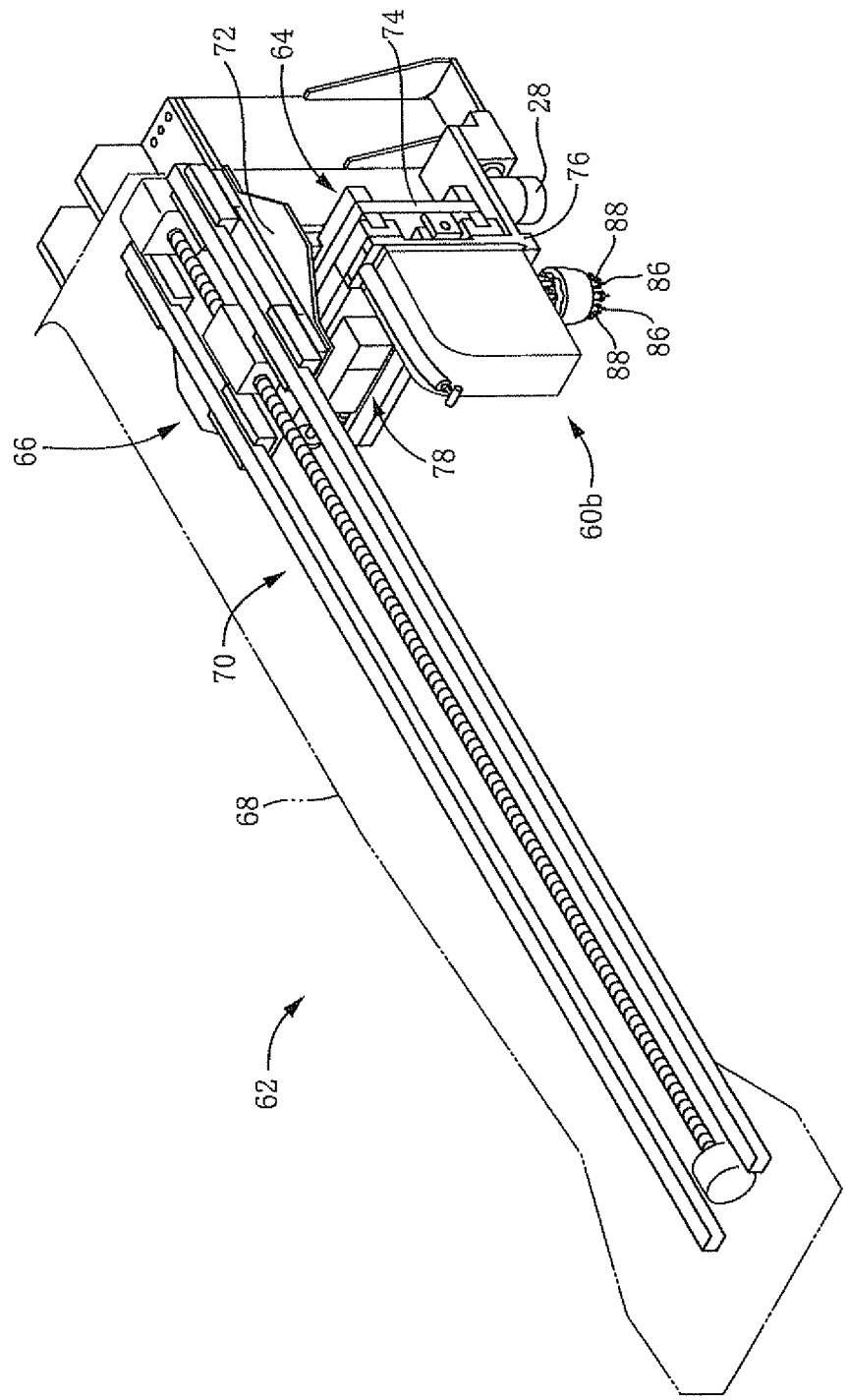
FIG. 3 is a perspective view showing a mounting head and a head moving device of a component mounter that is included in the above-described mounting module.

As shown in FIGS. 2 and 3, the component mounter 26 has a mounting head 60 as a working head and a head moving device 62 configured to move the mounting head 60. The head moving device 62 has a X-axis direction moving device 64 and a Y-axis direction moving device 66, as shown in FIG. 3. The Y-axis direction moving device 66 has a linear motor 70 provided in a beam 68 (that constitutes a portion of the module body 18), and bridges over the component supplying portions of the component suppliers 24 and the two board holders 22, so as to be configured to move a Y-axis slide 72 as a movable member to a desired position in the Y-axis direction. The X-axis direction moving device 64 is disposed on the Y-axis slide 72, and is movable relative to the Y-axis slide 72 in the X-axis direction. The X-axis direction moving device 64 has first and second X-axis slides 74, 76 movable relative to each other in the X-axis direction, and two X-axis-slide moving devices configured to move the respective first and second X-axis slides 74, 76. FIG. 3 shows an X-axis-slide moving device 78 which is one of the two X-axis-slide moving devices and which is configured to move the first X-axis slide 74. Each of the two X-axis-slide moving devices includes a servo motor (as a kind of electric rotary motor that is an example of a drive source) and a feed screw mechanism (having a ball screw and a nut), and is configured to move a corresponding one of the first and second X-axis slides 74, 76 to a desired position in the X-axis direction.

The mounting head 60 is detachably attached to the second X-axis slide 76, and is movable, by the head moving device 62, to any desired position within a movement area, i.e., a mounting operation area that bridges over the component supplying portions of the component suppliers 24 and the two board holders 22. The mounting head 60 is configured to hold an electronic circuit component through a suction nozzle 86 as an example of a component holder. In the present embodiment, there are available various kinds of mounting heads 60 which are different in the number of nozzle holders as examples of component-holder holding portions each holding the suction nozzle 86, so that a selected one of the mounting heads 60, which is selected depending on kind of the circuit board 40 (onto which the electronic circuit components are to be mounted), is attached to the second X-axis slide 76.

Figure 4A:
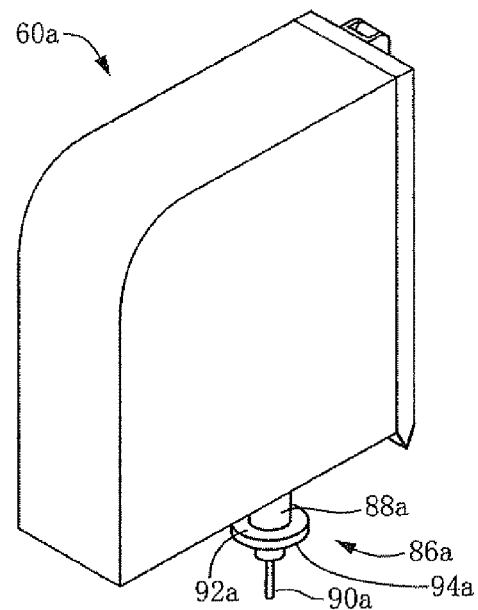
FIG. 4A is a perspective view showing, as the above-described mounting head, a mounting head having a single nozzle holder.
Figure 4B:
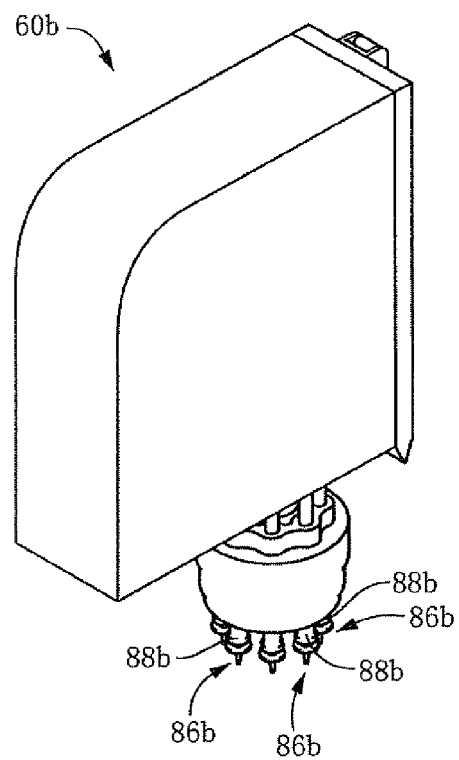
FIG. 4B is a perspective view showing, as the above-described mounting head, amounting head having a total of twelve nozzle holders.

For example, a mounting head 60a as shown in FIG. 4A has a single nozzle holder 88a that holds one suction nozzle 86a, while a mounting head 60b as shown in FIG. 4B has a total of twelve nozzle holders 88b, so as to be capable of holding twelve suction nozzles 86b as a maximum number of suction nozzles 86b. The number of the nozzle holders 88b does not necessarily have to be twelve but may be any number not smaller than two, preferably, not smaller than three. Each of the suction nozzles 86 includes a suction tube 90 and a background defining plate 92. In the present embodiment, there are available various kinds of suction nozzles 86 which are different in at least one of a diameter of the suction tube 90 (as measured at its suction surface) and a diameter of the background defining plate 92 (that has a circular shape in its plan view), so that one of the suction nozzles 86 is selected depending on the electronic circuit components (that are to be sucked) so as to be used. The background defining plate 92 has a background defining surface 94 provided by one of its opposite side surfaces which is closer to the suction tube 90 and which faces downwardly. In the present embodiment, the background defining surface 94 has a black color. The suction surface and the background defining plate 92a of the suction nozzle 86a have respective diameters larger than those of the suction surface and the background defining plate 92b of the suction nozzle 88b. The suction nozzle 86a is used to mount large-sized electronic circuit components.

Figure 5:
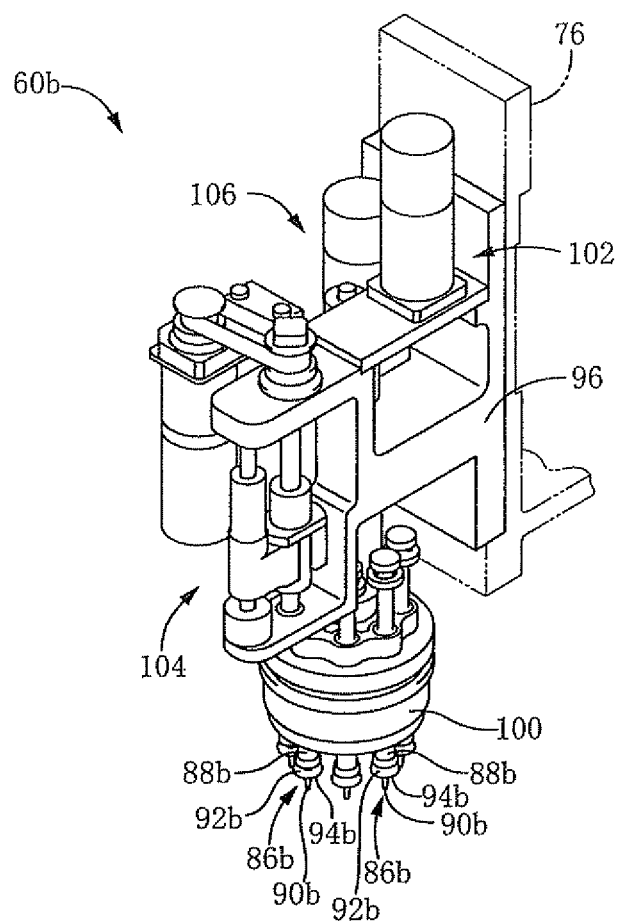
FIG. 5 is a perspective view showing the above-described mounting head having the twelve nozzle holders, with a cover of the mounting head being removed.

In the mounting head 60a, the nozzle holder 88a is vertically movable and rotatable by a movement device (not shown) that is provided in a main body of the mounting head 60a. The movement device serves as an elevating device and a rotating device, and is axially or vertically movable and rotatable about its axis relative to the main body of the mounting head 60a. As shown in FIG. 5, the mounting head 60b is a rotary-type mounting head having has a main body 96, a rotary body 100 which is attached to the main body 96 and which is rotatable about a vertical axis, and a rotating device 102 configured to rotate the rotary body 100 in forward or reverse direction by a desired degree of angle. The twelve nozzle holders 88*b* are disposed on respective portions of the rotary body 100 that are located in respective twelve positions which lie on a circle (whose center corresponds to the above-described vertical axial) and which are circumferentially spaced apart from each other by a suitable interval. In the present embodiment, the twelve positions are equi-angularly spaced apart from each other in a circumferential direction. Each of the twelve nozzle holders 88*b* is rotatable about its axis, and is movable in parallel to the above-described vertical axis relative to the rotary body 100. Each of the suction nozzles 86*b* is detachably held by a distal end portion of a corresponding one of the nozzle holders 88*b*, namely, by a lower end portion of the corresponding nozzle holder 88*b* in a state in which the mounting head 60*b* is attached to the second X-axis slide 76.

The twelve nozzle holders 88*b* (each of which is rotatable about its axis, as described above) are rotated about the above-described vertical axis by rotation of the rotary body 100 about the vertical axis, so as to be sequentially positioned in a component suction position (i.e., a component picking position) that corresponds to a predetermined one of twelve stop positions. When each of the nozzle holders 88*b* is positioned in the component suction position, the nozzle holder 88*b* is vertically moved by a movement device in the form of an elevating device 104 disposed in a portion of the main body 96 of the mounting head Bob, which portion positionally corresponds to the component suction position. Further, the nozzle holder 88*b* is rotated about its axis by a holder rotating device 106 that is provided in the main body 96. As shown in FIG. 3, the fiducial-mark-image taking device 28 is mounted on the second X-axis slide 76, and is moved together with the mounting head 60 by the head moving device 62, so as to take an image of a fiducial mark (not shown) provided on the circuit board 40.

As shown in FIG. 2, the component-image taking system 30 is disposed in a portion of the base portion 38 (that constitutes of the module body 18), which portion is located between the board conveying device 20 and the component supplier 24, so as to take images of the electronic circuit components (held by the respective suction nozzles 86) from under the components. As conceptually shown in FIG. 6, this component-image taking system 30 has a CMOS image sensor 120, a lighting device 121 (see FIG. 2) and an image-taking/processing control computer 122. As conceptually shown in FIG. 7, the CMOS image sensor 120 includes a plurality of unit cells 126 provided in an image taking area 124 of the image sensor 120. Each of the unit cells 126 is constituted by CMOS, and is configured to perform a photoelectric conversion. In the image sensor 120, the plurality of unit cells 126 are provided in the image taking area 124 that is a square area defined by two sides perpendicularly intersecting with each other, and are arranged in a lattice manner, i.e., in lines parallel to the respective two sides. Each of the unit cells 126 is identified by its coordinate values in XY-coordinate plane having coordinate axes that are parallel to the respective two sides. A single unit cell 126 corresponds to one pixel, and has a length defined by 1 as a corresponding one of the coordinate values. The image taking area 124 has a size that enables images of the respective twelve electronic circuit components, which are sucked by the respective suction nozzles 86*b* of the mounting head 60*b*, to be imaged together with each other. The image sensor 120 is disposed in the mounting module 10 such that X axis and Y axis of the XY-coordinate plane defined on the image taking area 124 are held in parallel to the above-described X-axis direction and Y-axis direction of the mounting module 10, respectively, i.e., X axis and Y axis of XY-coordinate plane defined in the mounting module 10, respectively. The lighting device 121 is disposed together with the image sensor 120, and is configured to illuminate an imaged subject from a lower side of the subject, i.e., from one of sides of the subject in which the image sensor 120 is located.

Figure 6:
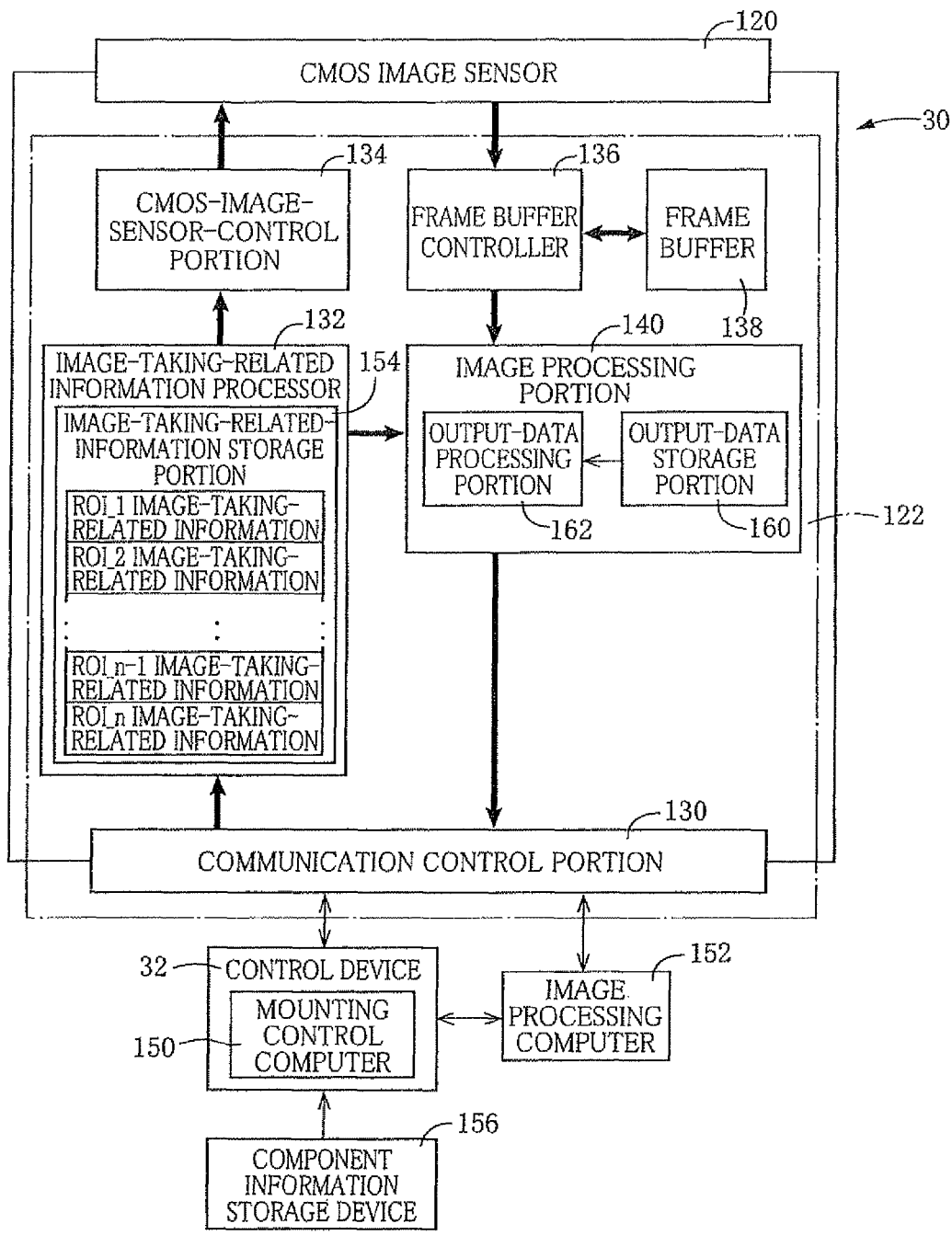
FIG. 6 is a block diagram conceptually showing a component-image taking system of the above-described mounting module.
Figure 7:
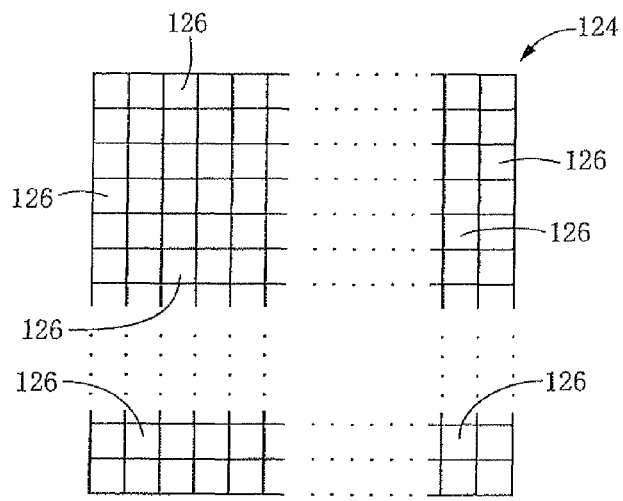
FIG. 7 is a plan view showing an image taking area of a CMOS image sensor of the above-described component-image taking system.

As shown in FIG. 6, the image-taking/processing control computer 122 has a communication control portion 130, an image-taking-related information processor 132, a CMOS-image-sensor control portion 134, a frame buffer controller 136, a frame buffer 138 and an image processing portion 140. The communication control portion 130 is configured to communicate with a mounting control computer 150 (that constitutes a major portion of the above-described control device 32 of the mounting module 10) and also to communicate with an image processing computer 152. The image processing computer 152 is connected to the mounting control computer 150, so as to supply data obtained by image processing, to the mounting control computer 150.

As shown in FIG. 6, the image-taking-related information processor 132 has an image-taking-related-information storage portion 154, so as to store therein an image-taking-related information and process the information. The image-taking-related information contains an interest-region setting data and an image-data acquiring condition data. The interest-region setting data (hereinafter referred to as ROI setting data) is a data required for setting regions of interest, and contains a data element representing a size of each of the regions of interest. In the present component-image taking system 30, each region of interest has a square shape, and the size of each region of interest is defined by two sides which are equal to each other and which perpendicularly intersect with each other. A length of each of the sides is expressed by a number of pixels (i.e., number of the unit cells 126) in the image taking area 124.

The image-data acquiring condition may include at least one of exposure time, gain, binning, brightening and lookup table. In the present component-image taking system 30, all of them are included in the image-data acquiring condition. The CMOS image sensor 120 has an electronic shutter configured to control a time interval between successive reading operations each of which is executed for reading an accumulated electric charge from each of the plurality of unit cells 126, so that the electric charge accumulated for a predetermined length of time as counted from a point of time of initiation of accumulation of the electric charge is outputted from each unit cell 126, each time the predetermine length of time passes since the initiation of accumulation of the electric charge in each unit cell 126. The accumulation of the electric charge for the predetermined length of time corresponds to an exposure operation that is executed for the image taking area 124. That is, the exposure operation is executed for the predetermined length of time (hereinafter referred to as "individual exposure time") so that the electric charge is accumulated for the same length of time. The electronic shutters operable for the respective unit cells 126 are provided in the CMOS-image-sensor-control portion 134. The gain is an amplification of an amount of each output of the CMOS image sensor 120. In the present component-image taking system 30, the outputs generated in the unit cells 126 are amplified by an amplifier that is common to the unit cells 126, and a amplification ratio is set for each electronic circuit component or each region of interest. It is noted that the CMOS image sensor may be provided with a mechanical shutter (that is mechanically opened and closed) in place of the electronic shutter. In this arrangement with the mechanical shutter, the individual exposure time is a length of time for which the image taking area 124 is exposed to a light by opening the mechanical shutter.

The binning is adding the outputs from adjacent ones of the unit cells 126 (e.g., four unit cells 126) that are adjacent to each other, so as to obtain a single value in the form of sum of the outputs. By execution of the binning, it is possible to reduce data amount and brighten the image. The image-data acquiring condition data contains a data element representing presence or absence of the binning. The brightening is a function of brightening an image, i.e., increase a brightness of the image, by offsetting an entirety of information of the image (outputs from the CMOS image sensor 120). The image-data acquiring condition data contains data elements representing presence or absence of the brightening and an offsetting amount upon execution of the brightening. A value of the brightness is set within a range of 0-255. When the value of the brightness is 0, the brightening is not executed. The lookup table is a table for correcting each data element contained in information representing the image. For example, when there is a region in which change of a signal output is small relative to change of light input and accordingly a boundary between a relatively light portion and a relatively dark portion is not clear, the lookup table is prepared for correcting the signal output so as to increase the change of the signal input relative to the change of the light input. The lookup table is stored in the image processing portion 140 of the image-taking/processing control computer 122. The image-data acquiring condition data contains a data element representing whether a data correction using the lookup table is to be made or not. The lookup table may be prepared for each of the regions of interest that are set within the image taking area 124.

The image-taking-related information is prepared for every one of the electronic circuit components that are planned to be mounted onto the circuit board. In the image-taking-related information prepared for an electronic circuit component whose image is taken without setting the corresponding region of interest, there is contained a data, as the ROI setting data, which represents that the size of the region of interest is zero, namely, which represents that no region of interest is set for the electronic circuit component in question. However, such a data may be eliminated in the image-taking-related information prepared for the electronic circuit component that is imaged without the corresponding region of interest. The image-data acquiring condition is determined suitably for each electronic circuit component by an acquiring-condition determiner that is constituted by the image-taking-related information processor 132.

The ROI setting data is prepared in a case in which the image data of each electric circuit component is acquired with setting of the region of interest. As such a case, for example, there are a case in which electronic circuit components are to be mounted onto the circuit board by the mounting head having a plurality of suction nozzles and the images of the components are formed together with each other on the image taking area 124, and also a case in which an electric circuit component is to be mounted onto the circuit board by the mounting head having a single suction nozzle and the component has a plurality of portions whose images are to be acquired by respective different conditions. In such a case, the ROI setting data is prepared and the image-data acquiring condition is determined for each of the regions of interest.

Figure 8:
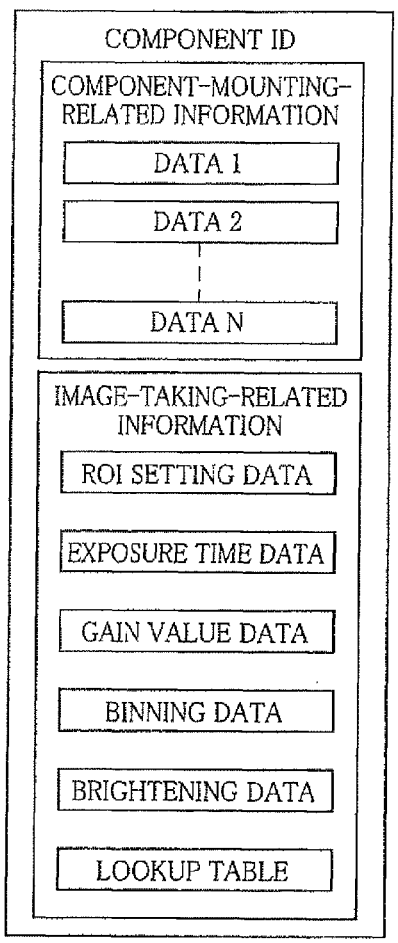
FIG. 8 is a view showing a mounting-related information and an image-taking-related information regarding an electronic circuit component, which are stored in an information storage device of the above-described mounting module.

As shown in FIG. 8, a component information storage device 156 (see FIG. 6) is configured to store therein the image-taking-related information together with the component-mounting-related information (that is prepared for each electronic circuit component) such that the image-taking-related information and component-mounting-related information are associated with a component ID or other data identifying the corresponding electric circuit component. As the component ID, it is possible to use a nomenclature of the component, a part number of the component or other identifying data enabling the component to be distinguished from the other component. Even among electronic circuit components having the same electric characteristics, the components could be different in material, color, shape and dimensions, since the material, color, shape and dimensions could vary, for example, depending on maker who manufactured the component. Therefore, such electronic circuit components should be identified by respective component IDs indicative of different kinds or components, so as to be distinguishable from each other. The mounting-related information is an information required for mounting the electric circuit component onto the circuit board. The mounting-related information contains, for example, data elements representing dimensions and shape of the electronic circuit component, pressing force required to pressing the component onto the circuit board, desired attitude of the component upon mounting thereof onto the circuit board, shape of package of the component and name of maker of the component. The component information storage device 156 is connected to the mounting control computer 150 so as to supply a component information (including the image-taking-related information and component-mounting-related information) to the image-taking/processing control computer 122.

The image-taking-related information is supplied to the image-taking/processing control computer 122 by the mounting control computer 150, and is processed by the image-taking-related information processor 132. The image-taking-related information processor 132 causes the image-taking-related-information storage portion 154 to store therein the image-taking-related information. The image-taking-related information is sorted into the data elements based on which the CMOS image sensor 120 is to be operated and the data elements based on which the image processing portion 140 is to be operated. The former data elements are supplied as commands to the CMOS-image-sensor-control portion 134, while the latter data elements are supplied as commands to the image processing portion 140. In the present component-image taking system 30, the generation of the output at each region of interest, the exposure of each region of interest and the amplification of the output by the gain are executed in the CMOS image sensor 120, while the binning, brightening and the data correction in accordance with the lookup table are executed in the image processing portion 140. Further, the output as the image data supplied from the CMOS image sensor 120 is temporarily stored in the frame buffer 138, as needed, for thereby absorbing a difference between speed of supply of the output data by the CMOS image sensor 120 and speed of data processing by the image processing portion 140. It is noted that an electric signal representing the output data is converted from an analog signal into a digital signal before supply of the output data to the image-taking/processing control computer 122. In the present system 30, the output data is represented by a gradation value ranging from 0 to 255 after being converted into the digital signal. The gradation value of 0 indicates a pure black, while the gradation value of 255 indicates a pure black. That is, the darkness is reduced with increase of the gradation value. The frame buffer controller 136 is configured to cause the frame buffer 138 to temporarily store therein the output data supplied from the CMOS image sensor 120, and to supply the output data to the image processing portion 140. Further, the image processing portion 140 has an output-data storage portion 160 and an output-data processing portion 162, as shown in FIG. 6.

In the mounting module 10 constructed as described above, a selected one of the plurality of kinds of mounting heads 60 is attached to the second X-axis slide 76, for receiving the electronic circuit components supplied from the component supplier 24 and mounting them onto the circuit board 40. There will be described operations of mounting the electronic circuit components onto the circuit board 40 in a case in which the mounted head 60b is attached to the second X-axis slide 76.

The mounting head 60b has twelve suction nozzles 86b, and is moved toward the board holders 22 so as to mount the electronic circuit component onto the circuit board 40, in principle, after all of the twelve suction nozzles 86b have received the respective components from the feeders 46. The mounting head 60b is moved toward the board holders 22 via a position that is located over the CMOS image sensor 120. That is, before reaching the board holders 22, the mounting head 60b is stopped in the position in which its axis (i.e., the axis of the rotary body 100) is aligned with a center of the CMOS image sensor 120, i.e., a center of the image taking area 124, so that the twelve electronic circuit components are imaged while the mounting head 60b is being stopped in the position. The twelve electronic circuit components are all illuminated by a light irradiated from the lighting device 121, which is located under the electronic circuit components in this instance. The background defining plate 92, which is provided together with each of the twelve suction nozzles 86b, is located on a rear side (i.e., upper side) of the electronic circuit component (held by the suction nozzle 86b), namely, is located on one of opposite sides of the electronic circuit component which one is remote from the lighting device 121, so that the component is imaged together with the background defining surface 94 as a background. The background defining surface 94 having a black color absorbs the irradiated light, without causing the light to be reflected from the black surface 94, so that a front image of the component is clearly taken owing to the light reflected from the component. This image taking is executed in accordance with the image-taking-related information.

FIG. 9 shows, by way of example, a set of the image-taking-related information (consisting of twelve image-taking-related information) prepared for the twelve electronic circuit components that are to be mounted onto the circuit board 40 by the mounting head 60b. It is noted that the example of FIG. 9 is a fictitious example in which difference of sizes of the components are somewhat exaggerated for easier understanding. In general, electronic circuit components, which are to be held by a mounting head such as the mounting head 60b having a plurality of suction nozzles, have respective sizes that are not considerably different from each other, even if the components are different in kind from each other. The image-taking-related information, which have ID data representing component IDs of respective twelve electronic circuit components that are to be mounted on the circuit board 40, are read out from the component information storage device 156, and then supplied to the mounting control computer 150. Then, after preceding twelve electronic circuit components have been mounted onto the circuit board 40 by the mounting head Gob, and before the next twelve electronic circuit components (that are to be mounted onto the circuit board 40, following the preceding twelve components) are imaged, the image-taking-related information are supplied from the mounting control computer 150 to the image-taking/processing control computer 122, so as to be stored into the image-taking-related-information storage portion 154. The supply of the image-taking-related information from the component information storage device 156 to the mounting control computer 150 may be executed when the image-taking-related information are to be supplied from the mounting control computer 150 to the image-taking/processing control computer 122. The image-taking-related information, when having been supplied to the mounting control computer 150, may be stored into a storage portion of the computer 150, so as to be used. The image-taking-related information (regarding all the electronic circuit components that are to be mounted onto the circuit board 40) may be stored into the storage portion, prior to executions of a series of operations for mounting the electronic circuit components onto the circuit board 40 by the mounting head 60b.

The twelve electronic circuit components held by the mounting head 60b are concurrently irradiated by a light emitted by the lighting device 121, whereby images of the respective components are formed within the image taking area 124 as a result of reception of the light by the unit cells 126. Thus, an image data is acquired by a condition that is determined for each of the twelve electronic components, namely, determined for each of twelve regions of interest that are set in respective parts of the image taking area 124 which correspond to the respective twelve electronic circuit components whose images are formed concurrently with each other. To this end, the ROI setting data contains a data element representing a size of the region of interest.

Figure 10A:
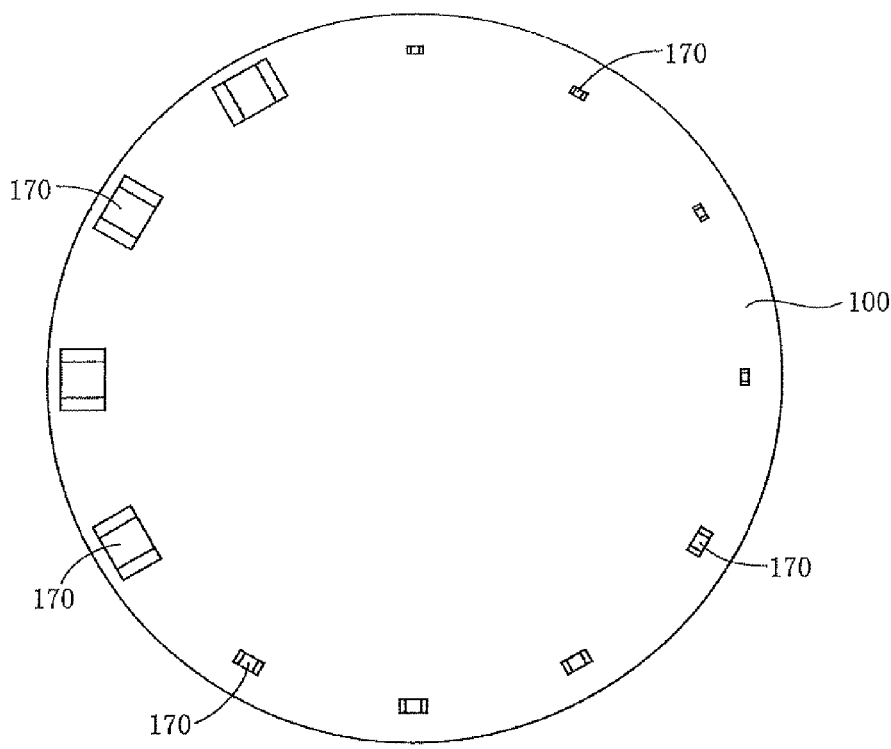
FIG. 10A is a view showing an arrangement of twelve electronic circuit components that are held by the single mounting head.
Figure 10B:
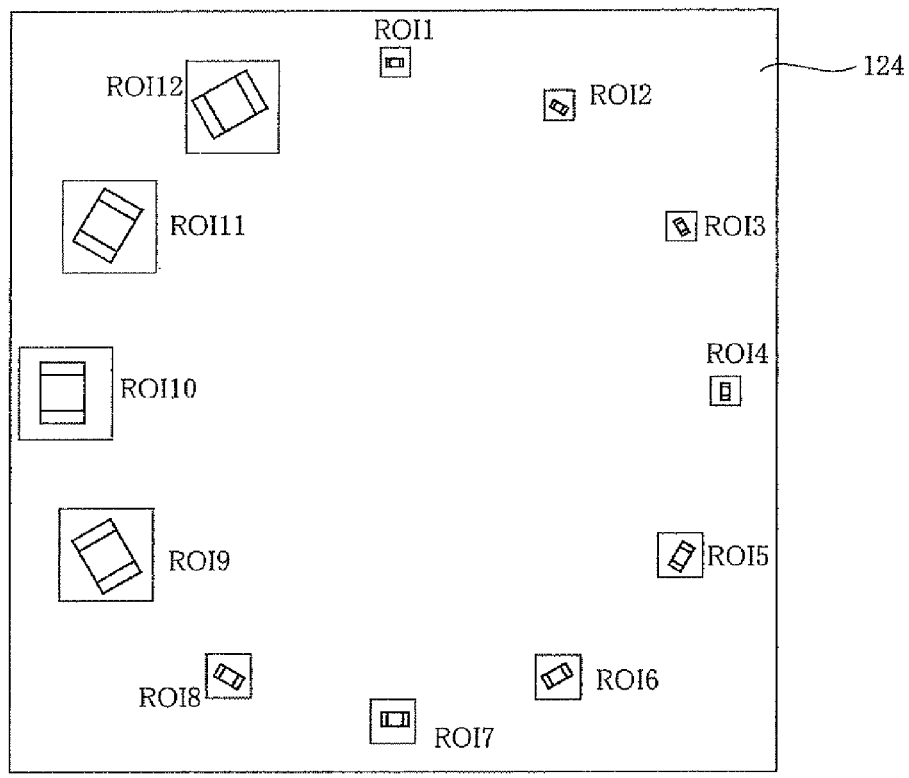
FIG. 10B is a view showing regions of interest which are set in the image taking area when the twelve electronic circuit components are imaged by the above-described component-image taking system.

Further, a set of component-angular-position information together with the set of image-taking-related information is supplied to image-taking/processing control computer 122. The set of component-angular-position information represent angular positions of the respective twelve electronic circuit components that are arranged about the rotation axis of the rotary body 100. As shown in FIG. 10A, angular positions of the respective twelve suction nozzles 86b are different from one another, as the angular positions of the respective twelve electronic circuit components 170. However, since order of arrangement of the suction nozzles 86b in a circumferential direction of the rotary body 100 is recognized in the mounting control computer 150, it is possible for the computer 150 to know the angular position of each of the twelve suction nozzles 86b when all of the twelve electronic circuit components have been received by the mounting head 60b from the component supplier 24. That is, it is possible to know which kind of the electronic circuit component is positioned in which one of the twelve stop positions upon completion of supply of all of the twelve components to the mounting head 60b from the component supplier 24. Each component-angular-position information contains data elements representing a turning radius of each component (i.e., a radius of circle on which the twelve nozzle holders 88b are located) and order of arrangement of the twelve components about the rotation axis of the rotary body 100. The arrangement order of each of the twelve components can be represented by its position relative to a reference component that is a predetermined one of the twelve components, or can be represented by its number that is counted from the reference component in the circumferential direction. In the example shown in FIG. 9, the twelve electronic circuit components consist of four kinds of the electronic circuit components, and at least two of the twelve components are of each one of the four kinds. Each image-taking-related information serving for a corresponding one of the twelve electronic circuit components is associated with the corresponding component-angular-position information, and is supplied together with the corresponding component-angular-position information to the image-taking-related information processor 132. In the image-taking-related information processor 132, each of the twelve image-taking-related information is specified by the arrangement order of the corresponding electronic circuit component (corresponding suction nozzle 86b), and each of the twelve regions of interest is also specified by the arrangement order of the corresponding electronic circuit component. In FIG. 9, "ROI No." represents the arrangement order of each electronic circuit component.

In the image-taking-related information processor 132, each of the twelve image-taking-related information is sorted into two groups, depending on where it is to be supplied. Specifically described, data elements representing the binning, brightening and lookup table are supplied to the image processing portion 140, while the ROI setting data and data elements representing the exposure time and gain are supplied to the CMOS-image-sensor-control portion 134. In the present embodiment in which each electronic circuit component is imaged by setting the corresponding region of interest, the position of each region of interest within the image taking area 124 is determined based on the corresponding ROI setting data and component-angular-position information in the image-taking-related information processor 132, and the ROI setting data and data elements representing exposure time and gain are supplied to the CMOS-image-sensor-control portion 134.

Each region of interest having a rectangular shape is set within the image taking area 124 such that the two perpendicularly intersecting sides of each region of interest are in parallel to the respective X-axis and Y-axis of the XY-coordinate plane defined on the image taking area 124. Since the attitude of each electronic circuit component (i.e., an inclination of each component with respect to the X-axis or Y-axis of the XY-coordinate plane) is changed depending on its angular position about the rotation axis of the rotary body 100, each of the regions of interest set for the respective electronic circuit components (whose images are to be formed on the image taking area 124 together with each other) has a square shape and a size which permits an entirety of the image of the corresponding electronic circuit component to be accommodated within the region of interest irrespective of change of the attitude of the component and which avoids the region of interest from overlapping with the adjacent region of interest (that is set for the adjacent electronic circuit component). Based on the angular position and turning radius of the component and the size, shape and attitude of the region of interest, it is possible to calculate data required for setting the region of interest within the image taking area 124. The calculated data is supplied to the CMOS-image-sensor-control portion 134. For example, such data may be indicative of a start point and an end point of the region of interest, i.e., two diagonal corner points of the rectangular region of interest that are represented by respective two sets of X-Y coordinate values, i.e., maximum and minimum X-Y coordinate values, or may be indicative of four corner points of the rectangular region of interest that are represented by respective four sets of X-Y coordinate values.

Figure 12:
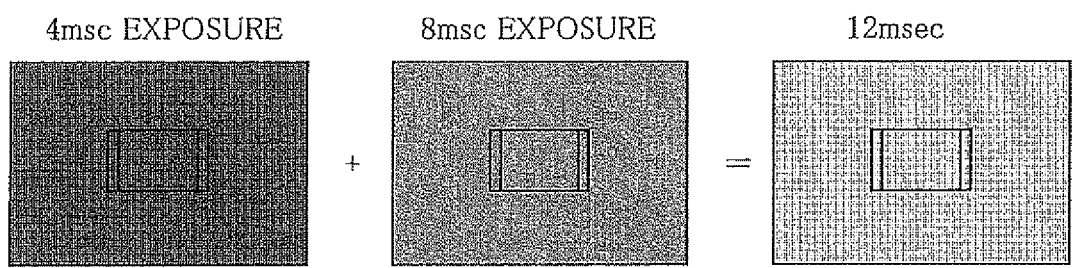
FIG. 12 is a set of views for explaining outputs generated by the respective exposure operations executed for predetermined lengths of time and a sum of the outputs generated by the respective exposure operations.

The image-taking-related information processor 132 is configured to determine, based on each exposure time determined as the image-data acquiring condition, the number of exposure operations executed in the CMOS image sensor 120 and also a length of time (i.e., the above-described individual exposure time) for which each of the exposure operations is to be executed. Then, image-taking-related information processor 132 supplies data elements representing the thus determined number of exposure operations and individual exposure time, to the CMOS-image-sensor-control portion 134. In the present embodiment, the number of exposure operations is equal to the number of kinds of exposure times each determined as the image-data acquiring condition, and the individual exposure time is equal to a length of time into which the determined exposure time is divided, so that resultant outputs generated as an image data in each region of interest as result of executions of the determined number of exposure operations are added to each other whereby the image data based on the determined exposure time is acquired. FIG. 12 shows an example in which an image data representing of an image of an electric circuit component is to be acquired by the image-data acquiring condition in the form of the predetermined exposure time of 12 msec. In this example of FIG. 12, a first exposure operation is executed for 4 msec and a second exposure operation is executed for 8 msec, and resultant outputs generated as results of executions of the first and second exposure operations are added to each other, so that it is possible to acquire the image data based on a sum of the resultant outputs that is equivalent to an output which would be generated as a result of execution of a single exposure operation of 12 msec.

In the present embodiment, where a plurality of different exposure times are determined, one of the plurality of exposure operations is executed for the individual exposure time in the form of a length of time equal to the smallest one of the different exposure times, and each of the other of the plurality of exposure operations is executed for the individual exposure time in the form of a length of time equal to a difference between a corresponding pair of the plurality of different exposure times. The corresponding pair of the plurality of different exposure times means a corresponding pair of the different exposure times which are adjacent to each other in an assumed arrangement of the different exposure times in order of length thereof, namely, in an assumed arrangement of the different exposure times in order from the largest one to the smallest one or from the smallest one to the largest one.

The image-taking-related information processor 132 is configured to determine a combination of at least one of the plurality of exposure operations, which is selected for each of the twelve regions of interest, such that the image data based on the corresponding exposure time can be acquired for each region of interest. The image-taking-related information processor 132 supplies data elements representing the number of exposure operations, the individual exposure times of the respective exposure operations and the combination of selected one or ones of the exposure operations, to the CMOS-image-sensor-control portion 134. It is noted that the data element representing the combination of selected one or ones of the exposure operations for each region of interest, is supplied to the image processing portion 140 as well as to the CMOS-image-sensor-control portion 134, such that the data element supplied to the two portions 134, 140 is associated with the ROI number of each region of interest.

In case of the example of FIG. 9, the determined exposure times consist of four different exposure times, i.e., 3 msec, 5 msec, 8 msec and 10 msec, so that the number of exposure operations is four, and the individual exposure times are 3 msec, 2 msec, 3 msec and 2 msec. Among these individual exposure times, for example, 3 msec as the first individual exposure time corresponds to the above-described smallest one of the different exposure times, and 2 msec as the second individual exposure time corresponds to the above-described difference between the corresponding pair of the different exposure times in the form of 3 msec and 5 msec. As shown in FIG. 11 by way of example, the first exposure operation is executed for 3 msec, the second exposure operation is executed for 2 msec, the third exposure operation is executed for 3 msec, and the fourth exposure operation is executed for 2 msec. The resultant outputs are generated in all of the twelve regions of interest as a result of each of the first through fourth exposure operations. However, the resultant outputs, which are generated in the twelve regions of interest as results of the four exposure operations are not all supplied to the image processing portion 140 serving as an output receiving portion. The supply of the resultant outputs from each of the twelve regions of interest is controlled by the CMOS-image-sensor-control portion 134 serving as an output supply controlling portion, such that the resultant output or outputs generated by a selected one or ones of the exposure operations are supplied from each of the twelve regions of interest to the image processing portion 140, wherein the selected one or ones of the exposure operation are selected in accordance with the data element representing the combination of selected one or ones of the exposure operations for the each of the twelve regions of interest. Described specifically, the resultant outputs generated by the first exposure operation (of 3 msec) are supplied from all the twelve regions of interest ROI_1-12, the resultant outputs generated by the second exposure operation (of 2 msec) are supplied from the regions of interest ROI_5-12 and are not supplied from the regions of interest ROI_1-4, the resultant outputs generated by the third exposure operation (of 3 msec) are supplied from the regions of interest ROI_9-12 and are not supplied from the regions of interest ROI_1-8, and the resultant outputs generated by the fourth exposure operation (of 2 msec) are supplied from the regions of interest ROI_11-12 and are not supplied from the regions of interest ROI_1-10, as shown in FIG. 11. All of the twelve electronic circuit components are illuminated by a light irradiated from the lighting device 121, and the images of the respective twelve components are formed together with one another on the image taking area 124 as a result of reception of the light by the unit cells 126. However, the supply of the outputs in the form of electric charges from each of the regions of interest is made in a manner that varies depending on the kind of electronic circuit component, so that it is possible to acquire an image data set containing twelve image data for the respective twelve regions of interest such that each of the acquired image data is based on the exposure time that varies depending on the kind of electronic circuit component. FIG. 11 shows which ones of the twelve regions of interest the electric charges as the resultant outputs are supplied from, after execution of each of the first through fourth exposure operations.

After executions of the four exposure operations, an output adding operation is executed for adding the resultant outputs supplied from each of the twelve regions of interest as results of executions of the four exposure operations. In the adding operation for each of the regions of interest ROI_1-4 in which the determined exposure time is equal to the individual exposure time of the first exposure operation, the outputs generated by the second through fourth exposure operations (of 2 msec, 3 msec, 2 msec) are not added to the output generated by the first exposure operation (of 3 msec), since the outputs generated by the second through fourth exposure operations (of 2 msec, 3 msec, 2 msec) are not supplied from each of the regions of interest ROI_1-4 to the image processing portion 140. Thus, the image data acquired for each of the regions of interest ROI_1-4 is based on the output generated by the first exposure operation (of 3 msec). In the adding operation for each of the regions of interest ROI_5-8 in which the determined exposure time is equal to a sum of the individual exposure times of the respective first and second exposure operations (of 3 msec, 2 msec), the outputs generated by the respective first and second exposure operations (of 3 msec, 2 msec) are added to each other, whereby the image data acquired for each of the regions of interest ROI_5-8 is based on the outputs generated by the respective first and second exposure operations (of 3 msec, 2 msec). In the adding operation for each of the regions of interest ROI_9-10 in which the determined exposure time is equal to a sum of the individual exposure times of the respective first through third exposure operations (of 3 msec, 2 msec, 3 msec), the outputs generated by the respective first through third exposure operations (of 3 msec, 2 msec, 3 msec) are added to one another, whereby the image data acquired for each of the regions of interest ROI_9-10 is based on the outputs generated by the respective first through third exposure operations (of 3 msec, 2 msec, 3 msec). In the adding operation for each of the regions of interest ROI_11-12 in which the determined exposure time is equal to a sum of the individual exposure times of the respective first through fourth exposure operations (of 3 msec, 2 msec, 3 msec, 2 msec), the outputs generated by the respective first through fourth exposure operations (of 3 msec, 2 msec, 3 msec, 2 msec) are added to one another, whereby the image data acquired for each of the regions of interest ROI_11-12 is based on the outputs generated by the respective first through fourth exposure operations (of 3 msec, 2 msec, 3 msec, 2 msec). It is noted that it is possible to interpret that the output adding operation for each of the twelve regions of interest is executed for obtaining a sum of products of the resultant outputs and respective coefficients. According to this interpretation, the sum obtained for each of the twelve regions of interest is as follows:

(Sum for ROI_1-4)=(Output by 1st Exposure)×1+ (Output by 2nd Exposure)×0+(Output by 3rd Exposure)×0+(Output by 4th Exposure)×0;

(Sum for ROI_5-8)=(Output by 1st Exposure)×1+ (Output by 2nd Exposure)×1+(Output by 3rd Exposure)×0+(Output by 4th Exposure)×0;

(Sum for ROI_9-10)=(Output by 1st Exposure)×1+ (Output by 2nd Exposure)×1+(Output by 3rd Exposure)×1+(Output by 4th Exposure)×0; and (Sum for ROI_11-12)=(Output by 1st Exposure)×1+ (Output by 2nd Exposure)×1+(Output by 3rd Exposure)×1+(Output by 4th Exposure)×1.

In this interpretation, the output or outputs, which are generated by one or ones of the first through fourth exposure operations and which are not supplied to the image processing portion 140 (serving as the above-described output receiving portion), are multiplied by zero.

The electric charges as the outputs generated from the unit cells 126 are supplied from the CMOS image sensor 120 to the image processing portion 140, after having being converted into digital signals. The outputs supplied from each of the regions of interest is stored into the output-data storage portion 160 of the image processing portion 140, such that the stored output is associated with the corresponding ROI number. After the executions of the four exposure operations, the above-described output adding operation is executed by the output-data processing portion 162 of the image processing portion 140, by adding the outputs stored in the output-data storage portion 160 of the image processing portion 140. It is noted that, after the output adding operation, the outputs supplied from the regions of interest ROI_9-12 are subjected to the above-described binning, and that the outputs supplied from the regions of interest ROI_11-12 are subjected to the above-described brightening. The binning and brightening are executed also in the output-data processing portion 162.

Thus, the regions of interest are set for the respective electronic circuit components whose images are to be formed together with each other on the image taking area 124, and the image data set representing the images of the respective components are acquired by the respective image-data acquiring conditions that are determined suitably for the respective regions of interest, so that excellent images can be obtained as the images of the respective components, even by concurrently taking the images of the respective components that are different from each other with respect to the required image-data acquiring condition. In the above-described example of FIG. 9, for example, the exposure times for obtaining the images of the four kinds of electronic circuit components are determined to be different from each other. A light reflectance varies not only depending on the electric characteristics of the component but also depending on other factors such as the maker of the component, the color of the component and the material of the component. That is, even among the resistors, capacitors or other components having the same electric characteristics, there could be difference in the light reflectance. In view of this, evaluation tests are made for obtaining information regarding brightness or darkness of images of the respective components, for determining the exposure times suitable for the respective components. For example, the exposure time for the capacitor A having a white color in its main body and accordingly having a high light reflectance is determined to be shorter than the exposure time determined for the capacitor B having a brown color in its main body and accordingly having a low light reflectance. As shown in FIG. 9, the exposure time determined for the capacitor B and the exposure time determined for the resistor of the rectangular chip having 0603 size are considerably different from each other. However, clear images can be obtained as the images of the respective components, by suitably determining the exposure times suitable for the respective regions of interest that are set for covering the respective components. Further, in the present embodiment, a sum of the individual exposure times of the respective four exposure operations, which are actually executed, is 10 msec (=3 msec +2 msec +3 msec +2 msec) that is much smaller than 26 msec (=3 msec +5 msec +8 msec +10 msec) as a sum of the four kinds of predetermined exposure times, thereby making it possible to reduce a length of time required for taking the images of the respective components and a cycle time required for completing a series of operations for mounting the components onto the circuit board. Further, by determining the different kinds of exposure times, it is possible to obtain clear images of the respective electronic circuit components having various light reflectances, without use of a CMOS image sensor capable of forming an image with a wide gradation range, which would lead to increase of amount of data representing the image.

The image data set acquired by processings performed in the output-data processing portion 162 is supplied from the communication control portion 130 to the image processing computer 152. In this instance, each image data is associated with data indicative of the image of which one of the electronic circuit components is represented by the image data in question, namely, data representing the ROT number of the component whose image data is represented by the image data in question (i.e., the arrangement order of the component in the rotary body 100), while being supplied from the communication control portion 130 to the image processing computer 152.

In the image processing computer 152, the positional error of each electronic circuit component held by the corresponding suction nozzle 86 is calculated or detected based on the corresponding image data supplied from the image-taking/processing control computer 122, and then the detected positional error is supplied as data to the mounting control computer 150. The data representing the positional error of each electronic circuit component contains data elements indicative of deviation of an actual position of the component from a desired position of the component in the X-axis direction and Y-axis direction and a deviation of an actual attitude of the component from a desired attitude of the component (i.e., deviation of an actual angular position of each component about the axis of the component from a desired angular position of each component about the axis of the component). The positional error of the component is corrected or reduced by operation of the head moving device 62 which is controlled based on the detected positional error by the control device 32, and then the component is mounted onto the circuit board with the positional error being corrected or reduced. Owing to setting of the regions of interest, the image data of the respective twelve electronic circuit components are acquired by the suitable image-data acquiring conditions whereby the images of the respective components are satisfactorily obtained, thereby making it possible to accurately calculate the positional error of the component and accordingly to mount the component onto the circuit board with improved precision. It is noted that, in addition to the positional error of each component held by the corresponding suction nozzle 86, a positional error of component mounted portions of the circuit board 40 held by the board holder 22 (including a deviation of an actual position of the circuit board 40 from a desired position of the circuit board 40 in the X-axis direction and Y-axis direction and a deviation of an actual attitude of the circuit board 40 from a desired attitude of the circuit board 40) is corrected or reduced based on an image of the above-described fiducial mark that is taken by the fiducial-mark-image taking device 28. Upon mounting of each electronic circuit component onto the circuit board 40, a pressing force forcing the component against the board 40 and the attitude of the component upon mounting thereof onto the board 40 are controlled based on the mounting-related information which is associated with the component in question and which has been supplied together with the image-taking-related information from the component information storage device 156 to the mounting control computer 150. It is noted that the mounting-related information may be read out from the component information storage device 156, separately from the image-taking-related information.

Figure 13:
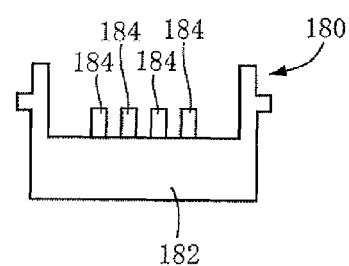
FIG. 13 is a view showing an electronic circuit component that is imaged by the above-described component-image taking system, with a plurality of regions of interest being set.

In the above-described embodiment, a plurality of regions of interest are set for taking images of a plurality of respective electronic circuit components. However, a plurality of regions of interest may be set even in a case in which an image of only a single electronic circuit component is taken, namely, in a case in which the component mounting operation is performed by, in place of the mounting head 60b, the mounted head 60a that is configured to hold a single electronic circuit component. For example, where the electronic circuit component includes a part having a high light reflectance and a part having a low light reflectance, regions of interest may be set for the respective parts having the different light reflectances, so as to acquire a set of image data for the respective parts of the single component. FIG. 13 shows, as an example of such a component, an electronic circuit component 180 in which a main body 182 has a low light reflectance while each lead 184 has a high light reflectance. For this component 180, a total of three regions of interest are set for two parts of the main body 182 and a part covering all the leads 184. Each of the two parts of the main body 182 and the part covering all the leads 184 constitutes an imaged subject, i.e., an image part as a part of the electronic circuit component.

Since the electronic circuit component 180 has three imaged parts, a total of three image-taking-related information are prepared for the component 180 while a single mounting-related information is prepared for the component 180. That is, the image-taking-related information is prepared for every one of the imaged subjects (i.e., every one of the imaged parts). The thus prepared three image-taking-related information and single mounting-related information are stored in the component information storage device 156, such that the stored information are associated with the component ID of the component 180. Each of the three image-taking-related information contains the ROI setting data and the image-data acquiring condition data. The ROI setting data contains a data element indicative of a start point and an end point of the corresponding region of interest that are represented by respective two sets of coordinate values. The exposure times are determined for the respective regions of interest such that the exposure time for the part having the high light reflectance is smaller than the exposure time for the part having the low light reflectance. The gain is set to a value (e.g., one) that is common to all of the three regions of interest. The binning and the data correction by the lookup table are not executed for any one of the regions of interest. The value of the brightness is set to, for example, 0 for every one of the regions of interest. Before the images of the three parts of the component 180 are taken, the three image-taking-related information are supplied to the image-taking-related information processor 132, so that the number of exposure operations, the individual exposure times of the respective exposure operations and the combination of selected one or ones of the exposure operations are determined for each of the regions of interest, and the determined number of exposure operations, individual exposure times and combination of selected one or ones of the exposure operations are supplied as data, together with a ROI position data and gain, to the CMOS-image-sensor-control portion 134, as in the above-described embodiment in which the components held by the mounting head 60*b* are imaged. The exposure times determined for the respective two parts of the main body 182 are equal to each other, so that there are two kinds of exposure times determined for the three regions of interest. The number of exposure operations is two. The individual exposure times consist of two different exposure times, i.e., a length of time corresponding to a smaller one of the two kinds of exposure times and a length of time corresponding to a difference between the two kinds of exposure times.

After the suction nozzle 86*a* receives the electronic circuit component 180 from the feeder 46, the mounting head 60*a* is moved toward a position that is located over the CMOS image sensor 120 and is stopped in the position in which an axis of the nozzle holder 88*a* is aligned with the center of the image taking area 124. Then, two exposure operations are sequentially executed whereby the two parts of the main body 182 and the part covering all the leads 184 are imaged, and the electric charge is outputted from each of the unit cells 126 constituting each region of interest after execution of each exposure operation. After executions of the two exposure operations, the outputs generated in each of the two regions of interest that are set for the respective two parts of the main body 182 are added to each other.

Figures 14A, 14B, 14C:
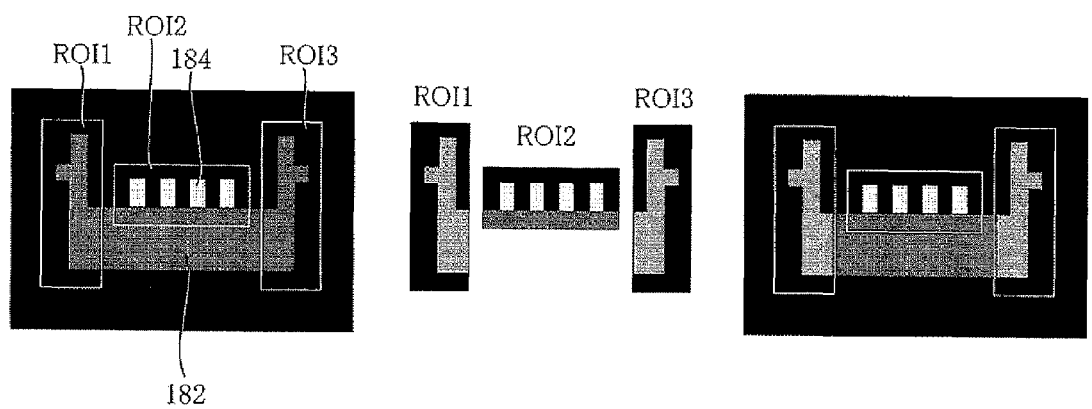
FIGS. 14A-14C is a set of views for explaining setting of regions of interest in a case in which an electronic circuit component including parts having different light.

Since the light reflectance of the main body 182 is low while the light reflectance of each lead 184 is high, the image of each lead 184 would be bright while the image of the main body 182 would be dark, as shown FIG. 14A, if a single exposure operation is performed evenly for an entirety of the electronic circuit component 180, namely, if the image data for the three regions of interest are acquired by the same exposure time. However, by acquiring the image data based on the exposure time determined for each region of interest, it is possible to brighten the image of the main body 182 as shown in FIG. 14B. Then, the thus acquired image data (that are originally generated in the respective three regions of interest) are supplied, together with the ROI position data indicative of positions of the respective three regions of interest within the image taking area 124, to the image processing computer 152. The ROI position data is supplied from the image-taking-related information processor 132 to the image processing computer 152, and the images of the two parts of the main body 182 and the image of the part covering the plurality of leads 184 can be processed based on the ROI position data, such that as if the processed images were images obtained as parts of an image of an entirety of the component 180, as shown in FIG. 14C, which is taken as a single image. Thus, bight images can be obtained as the images of the main body 182 so that it is possible to accurately obtain, for example, a data representing a profile of the component 180 and accordingly accurately detect the kind of electronic circuit component and the positional error of the component held by the suction nozzle.

As is clear from the above description, in the present mounting module 10, the image-taking-related information processor 132 of the image-taking/processing control computer 122 constitutes an interest-region setter configured to set a plurality of regions of interest within the image taking area and an exposure-time determining portion configured to determine at least two exposure times required for acquiring the respective at least two image data generated in the respective at least two of the plurality of regions of interest, such that the determined at least two exposure times are different from each other, namely, such that the determined exposure time required for acquiring the image data originally generated in each one of the at least two regions of interest as the plurality of regions of interest is different from the determined exposure time required for acquiring the image data originally generated in the other of the at least two regions of interest. The CMOS-image-sensor-control portion 134 constitutes a plural-exposure-operations executing portion configured to execute a plurality of exposure operations onto the image taking area of the image sensor. The output-data processing portion 162 of the image processing portion 140 constitutes an output-adding-operation executing portion. The CMOS-image-sensor-control portion 134 and the output-data processing portion 162 cooperate with each other to constitute an image-data acquirer in the form of an exposure-time-based-image-data acquiring portion that is configured to acquire the at least two image data generated in the respective at least two regions of interest, such that the acquired at least two image data are based on the respective at least two exposure times that are different from each other. Further, the component information storage device 156 constitute an information storage. The image processing computer 152 includes: a portion configured to detect or calculate a positional error of each electronic circuit component held by the corresponding suction nozzle 86, based on the image data of the electronic circuit component; a portion configured to detect or calculate a positional error of component mounted portions of the circuit board held by the board holder 22, based on the image of the fiducial mark that is taken by the fiducial-mark-image taking device 28; and a portion configured to control the head moving device 62 and the holder rotating device 106 of the mounting control computer 150 so as to correct or reduce the positional error of each electronic circuit component and the positional error of the component mounted portions of the circuit board and to control the component mounter 26 such that each electronic circuit component is mounted onto the circuit board with the positional errors being reduced. Theses portions of the image processing computer 152 cooperate with one another to constitute a component mounting controller.

The component information including the mounting-related information and the image-taking-related information may be stored in the storage portion of the mounting control computer 150, or may be supplied to the mounting control computer 150 from a central computer configured to control an entirety of the electronic-circuit-component mounting system including the mounting modules 10. In the former arrangement, the information storage is constituted by the storage portion of the mounting control computer 150. In the latter arrangement, the information storage is constituted by a portion of the central computer which is assigned to store therein the component information or a portion of the mounting control computer 150 which is assigned to store therein the supplied component information.

Further, where a plurality of respective imaged parts, such as the main body 182 and leads 184 of the electronic circuit component 180, which have respective light reflectances considerably different from each other, are to be imaged by setting respective regions of interest, the gains for the respective regions of interest may be adapted to be different from each other, in place of or in addition to the arrangement in which the determined exposure times for the respective regions of interest are adapted to be different from each other. Where the gains are adapted to be different from each other, the gain for the region of interest that is set for the part having a high light reflectance is set to a value smaller than a value of the gain for the region of interest that is set for the part having a low light reflectance. Further, where the gains for the respective regions of interest are adapted to be different from each other with the determined exposure time being to common to all of the regions of interest, a single exposure operation is executed with the common exposure time being set equal to an average of exposure times suitable for the respective regions of interest or with the common exposure time being set equal to one of the exposure times which is suitable for the region of interest set for the part having the low light reflectance. Where only the gains are adapted to be different from each other, excellent images of the plurality of respective parts having the different light reflectances can be obtained, by taking the images by a single operation at once, without requiring a large length of time that would be required, for example, in an arrangement in which the images of the respective parts having the different light reflectances are taken by a plurality of respective operations with respective conditions suitable for the respective parts. The gains may be made different from each other by an amplifier that is common to the plurality of unit cells that constitute the image taking area. The resultant output may be amplified after being supplied from the CMOS image sensor and converted into a digital signal that is represented by a gradation value.

In the above-described embodiment, the binning, brightening and the data correction in accordance with the lookup table are executed in the image processing portion 140. However, at least one of them may be executed in the CMOS image sensor 120. In this modified arrangement, a data element relating to each of the at least one of them is supplied from the image-taking-related information processor 132 to the CMOS-image-sensor-control portion 134.

Where a plurality of exposure operations are executed for the image sensor and then resultant outputs generated as results of executions of the exposure operations are added to each other, the output generated as a result of execution of each of at least one of the exposure operation may be added a plurality of times in the output adding operation. In the above-described embodiment, for obtaining the images of the respective twelve electronic circuit components as shown in FIG. 9, the number of exposure operations is four which is equal to the number of kinds of exposure times and the individual exposure times of the respective four exposure operations are 3 msec, 2 msec, 3 msec and 2 msec, as shown in FIG. 11. That is, in the above-described embodiment, two of the four exposure operations have the same individual exposure time of 3 msec and other two of the four exposure operations have the same individual exposure time of 2 msec. FIG. 15 shows another embodiment in which the number of exposure operations is two, and the individual exposure times are 3 msec and 2 msec. The first exposure operation is executed for 3 msec, and the second exposure operation is executed for 2 msec. The resultant outputs are generated in all of the twelve regions of interest as a result of either of the first and second exposure operations. The resultant outputs generated by the first exposure operation (of 3 msec) are supplied from all the twelve regions of interest ROI_1-12, and the resultant outputs generated by the second exposure operation (of 2 msec) are supplied from the regions of interest ROI_5-12 and are not supplied from the regions of interest ROI_1-4, as shown in FIG. 11. After executions of the two exposure operations, the output adding operation is executed for adding the resultant outputs supplied from each of the twelve regions of interest as results of executions of the two exposure operations. In the adding operation for each of the regions of interest ROI_1-4, the output generated by the second exposure operation (of 2 msec) is not added to the output generated by the first exposure operation (of 3 msec), since the output generated by the second exposure operation (of 2 msec) is not supplied from each of the regions of interest ROI_1-4 to the image processing portion 140. Thus, the image data acquired for each of the regions of interest ROI_1-4 is based on the output generated by the first exposure operation (of 3 msec). In the adding operation for each of the regions of interest ROI_5-8, the outputs generated by the respective first and second exposure operations (of 3 msec, 2 msec) are added to each other, whereby the image data acquired for each of the regions of interest ROI_5-8 is based on the outputs generated by the respective first and second exposure operations (of 3 msec, 2 msec). In the adding operation for each of the regions of interest ROI_9-10 in which the determined exposure time is 8 msec, the output generated by the first exposure operation (of 3 msec) is multiplied by two, and the thus multiplied output is added to the output generated by the second exposure operation (of 2 msec), whereby the image data acquired for each of the regions of interest ROI_9-10 is based on the exposure time of 8 msec. In the adding operation for each of the regions of interest ROI_11-12 in which the determined exposure time is 10 msec, the output generated by the first exposure operation (of 3 msec) and the output generated by the second exposure operation (of 2 msec) are multiplied by two, and the thus multiplied outputs are added to each other, whereby the image data acquired for each of the regions of interest ROI_11-12 is based on the exposure time of 10 msec.

Thus, in this embodiment shown in FIG. 15, the number of exposure operations and a sum of the individual exposure times of the respective exposure operations can be made smaller, and a total length of time required for taking the image can be made smaller, as compared with the above-described embodiment in which the two exposure operations are executed for 3 msec and the other two exposure operations are executed for 2 msec. In this embodiment shown in FIG. 15, too, it is possible to interpret that the output adding operation for each of the twelve regions of interest is executed for obtaining a sum of products of the resultant outputs and respective coefficients. According to this interpretation, the sum obtained for each of the twelve regions of interest is as follows:

(Sum for ROI_1-4)=(Output by 1st Exposure)×1+
(Output by 2nd Exposure)×0;

(Sum for ROI_5-8)=(Output by 1st Exposure)×1+
(Output by 2nd Exposure)×1;

(Sum for ROI_9-10)=(Output by 1st Exposure)×2+
(Output by 2nd Exposure)×1; and (Sum for ROI_11-12)=(Output by 1st Exposure)×2+
(Output by 2nd Exposure)×2.

In the present embodiment, the output-adding-operation executing portion can be interpreted to include a portion configured to obtain the sum of the products of the resultant outputs and the respective coefficients, such that each of at least one of the resultant outputs generated in at least one of the plurality of regions of interest is multiplied by a corresponding one of the coefficients which is an integer number not smaller than two.

There will be described other embodiments in each of which a plurality of exposure operations are executed for the image sensor and the output adding operation is executed by using at least one coefficient (by which a corresponding of the resultant outputs is multiplied) being other than one. FIG. 16 shows another embodiment in which a total of four regions of interest ROI_1-4 are set within the image taking area, and the exposure times determined for the respective four regions of interest are 3 msec, 7 msec, 12 msec and 18 msec, which are different from each other. If the number of exposure operations were set to be the same as the number of kinds of determined exposure times, the number of exposure operations would be four. And, if the individual exposure times of the respective exposure operations were determined such that one of the exposure operations is executed for the individual exposure time equal to the smallest one of the different exposure times and such that each of the other of the exposure operations is executed for the individual exposure time equal to a difference between a corresponding pair of the different exposure times, the individual exposure times of the respective four exposure operations would be 3 msec, 4 msec, 5 msec and 6 msec. However, in this embodiment shown in FIG. 16, the number of exposure operations is set to three, and the individual exposure times of the respective three exposure operations are 3 msec, 4 msec and 5 msec, as shown in FIG. 16. The first exposure operation is executed for 3 msec, the second exposure operation is executed for 4 msec, and the third exposure operation is executed for 5 msec. The resultant outputs are generated in all of the four regions of interest as a result of each of the first through third exposure operations. The resultant outputs generated by the first exposure operation (of 3 msec) are supplied from all the four regions of interest ROI_1-4, the resultant outputs generated by the second exposure operation (of 4 msec) are supplied from the regions of interest ROI_2-4 and are not supplied from the region of interest ROI_1, and the resultant outputs generated by the third exposure operation (of 5 msec) are supplied from the regions of interest ROI_3,4 and are not supplied from the region of interest ROI_1,2, as shown in FIG. 16. After executions of the three exposure operations, the output adding operation is executed for adding the resultant outputs supplied from each of the four regions of interest as results of executions of the three exposure operations. In the adding operation for the region of interest ROI_1, the outputs generated by the second and third exposure operations (of 4 msec, 5 msec) are not added to the output generated by the first exposure operation (of 3 msec), since the outputs generated by the second and third exposure operations (of 4 msec, 5 msec) are not supplied from the region of interest ROI_1 to the image processing portion 140. Thus, the image data acquired for the region of interest ROI_1 is based on the output generated by the first exposure operation (of 3 msec). In the adding operation for the region of interest ROI_2, the outputs generated by the respective first and second exposure operations (of 3 msec, 4 msec) are added to each other, whereby the image data acquired for the region of interest ROI_2 is based on the outputs generated by the respective first and second exposure operations (of 3 msec, 4 msec). In the adding operation for the region of interest ROI_3, the outputs generated by the respective first through third exposure operations (of 3 msec, 4 msec, 5 msec) are added to one another, whereby the image data acquired for the region of interest ROI_3 is based on the outputs generated by the respective first through third exposure operations (of 3 msec, 4 msec, 5 msec). In the adding operation for the region of interest ROI_4 in which the determined exposure time is 18 msec, the outputs generated by the respective first through third exposure operations (of 3 msec, 4 msec, 5 msec) are added to one another, the output generated by the second exposure operation (of 4 msec) is multiplied by 1.5, and the thus multiplied output is added to the added outputs generated by the respective first through third exposure operations (of 3 msec, 4 msec, 5 msec), whereby the image data acquired for the region of interest ROI_4 is based on the exposure time of 18 msec. That is, by multiplying the output generated by the second exposure operation (of 4 msec) by 1.5, it is possible to obtain an output that can be generated by execution of an exposure operation for the individual exposure time of 6 msec, which is equal to a difference between the determined exposure time (18 msec) for the region of interest ROI_4 and a sum of the individual exposure times of the respective first through third exposure operations (of 3 msec, 4 msec, 5 msec). In the adding operation for the region of interest ROI_4, it is possible to interpret that the outputs generated by the respective first and third exposure operations (of 3 msec, 5 msec) are added to each other, the output generated by the second exposure operation (of 4 msec) is multiplied by 2.5, and the thus multiplied output is added to the added outputs generated by the respective first and third exposure operations (of 3 msec, 5 msec).

Thus, in this embodiment shown in FIG. 16, the number of exposure operations and a sum of the individual exposure times of the respective exposure operations can be made small, and a total length of time required for taking the image can be made small. In this embodiment shown in FIG. 16, too, it is possible to interpret that the output adding operation for each of the four regions of interest is executed for obtaining a sum of products of the resultant outputs and respective coefficients. According to this interpretation, the sum obtained for each of the four regions of interest is as follows:

(Sum for ROI_1)=(Output by 1st Exposure)×1+(Output by 2nd Exposure)×0+(Output by 3rd Exposure)×0;

(Sum for ROI_2)=(Output by 1st Exposure)×1+(Output by 2nd Exposure)×1+(Output by 3rd Exposure)×0;

(Sum for ROI_3)=(Output by 1st Exposure)×1+(Output by 2nd Exposure)×1+(Output by 3rd Exposure)×1; and (Sum for ROI_4)=(Output by 1st Exposure)×1+(Output by 2nd Exposure)×2.5+(Output by 3rd Exposure)×1.

It is noted that this embodiment may be modified such that, in the adding operation for the region of interest ROI_4, the multiplication of the output generated by the second exposure operation (of 4 msec) by 1.5 may be replaced by multiplication of the output generated by the third exposure operation (of 5 msec) by 1.2 or multiplication of the output generated by the first exposure operation (of 3 msec) by 2, so as to obtain an output that can be generated by execution of an exposure operation for the individual exposure time of 6 msec.

The output adding operation may be executed by using at least one coefficient (by which a corresponding of the resultant outputs is multiplied) that is provided by a negative value. FIG. 17 shows another embodiment in which a total of four regions of interest ROI_1-4 are set within the image taking area, and the exposure times determined for the respective four regions of interest are 3 msec, 5 msec, 9 msec and 16 msec, which are different from each other. If the number of exposure operations were set to be the same as the number of kinds of determined exposure times, the number of exposure operations would be four. And, if the individual exposure times of the respective exposure operations were determined such that one of the exposure operations is executed for the individual exposure time equal to the smallest one of the different exposure times and such that the other of the exposure operations is executed for the individual exposure time equal to a difference between a corresponding pair of the different exposure times, the individual exposure times of the respective four exposure operations would be 3 msec, 2 msec, 4 msec and 7 msec. However, in this embodiment shown in FIG. 17, the number of exposure operations is set to three, and the individual exposure times of the respective three exposure operations are 5 msec, 4 msec and 7 msec, as shown in FIG. 17. The first exposure operation is executed for 5 msec, the second exposure operation is executed for 4 msec, and the third exposure operation is executed for 7 msec. The resultant outputs are generated in all of the four regions of interest as a result of each of the first through third exposure operations. The resultant outputs generated by the first exposure operation (of 5 msec) are supplied from the regions of interest ROI_2,3,4, and are not supplied from the region of interest ROI_1. The resultant outputs generated by the second exposure operation (of 4 msec) are supplied from the regions of interest ROI_1, 3, 4, and are not supplied from the region of interest ROI_2. The resultant outputs generated by the third exposure operation (of 7 msec) are supplied from the regions of interest ROI_1,4, and are not supplied from the regions of interest ROI_2, 3, as shown in FIG. 17. In the adding operation for the region of interest ROI_1 in which the determined exposure time is 3 msec, the output generated by the second exposure operation (of 4 msec) is multiplied by −1, and the thus multiplied output is added to the output generated by the third exposure operation (of 7 msec), whereby the image data acquired for the region of interest ROI_1 is based on the exposure time of 3 msec (=7 msec−4 msec).

Thus, in this embodiment shown in FIG. 17, too, the number of exposure operations and a sum of the individual exposure times of the respective exposure operations can be made small, and a total length of time required for taking the image can be made small. Further, it is possible to interpret that the output adding operation for each of the four regions of interest is executed for obtaining a sum of products of the resultant outputs and respective coefficients. According to this interpretation, the sum obtained for each of the four regions of interest is as follows:

(Sum for ROI_1)=(Output by 1st Exposure)×0+(Output by 2nd Exposure)×−1+(Output by 3rd Exposure)×1;

(Sum for ROI_2)=(Output by 1st Exposure)×1+(Output by 2nd Exposure)×0+(Output by 3rd Exposure)×0;

(Sum for ROI_3)=(Output by 1st Exposure)×1+(Output by 2nd Exposure)×1+(Output by 3rd Exposure)×0; and (Sum for ROI_4)=(Output by 1st Exposure)×1+(Output by 2nd Exposure)×1+(Output by 3rd Exposure)×1.

Where the images of the plurality of respective electronic circuit components are formed together with each other, too, each of at least one of the regions of interest may be set for a part of a corresponding one of the components, so that the image-data acquiring conditions are determined for the thus set regions of interest. Further, each of at least one of the regions of interest may be set for an entirety of a corresponding one of the components while each of the other of the regions of interest may be set for a part of a corresponding one of the components, so that the image-data acquiring conditions are determined for the thus set regions of interest.

Further, the lookup table, which is used for correcting the output generated by each exposure operation, may be prepared for each one of the regions of interest.

Further, where the images of the plurality of respective electronic circuit components held by the mounting head are formed together with each other, each region of interest does not have be set for every one of the components, but may be set for at least two of the components. For example, in a case in which the plurality of components include at least two components which are of the same kind and which are arranged adjacent to each other, namely, in a case in which the components includes at least two components of the same image-data acquiring condition that are arranged adjacent to each other, it is possible to set an region of interest in a part of the image taking area which is assigned to take images of the adjacent components of the same kind.

Moreover, the component-image taking system may be a system configured to take, as the image of an imaged subject, a silhouette image of the imaged subject.

Further, the component-image taking system may be a system that is movable together with a working head (mounting head) by the head moving device. Where the component-image taking system is movable together with the working head, the component-image taking system is moved together with a mounting head (like the above-described mounting head 60b) having a plurality of component-holder holding portions, so as to take images of respective electronic circuit components (held by the mounting head) one by one. This arrangement is effective to take an image or images of an electric circuit component (such as the above-described electric circuit component 180) having a plurality of parts which are to be imaged by the respective image-data acquiring conditions different from each other.

Moreover, the claimable invention is applicable not only to the image taking system provided in the electronic-circuit-component mounting machine, but also to an image taking system which is provided in a mounting inspection machine for inspecting a state of mounting of an electronic circuit component on a circuit board and which is configured to take an image of the electronic circuit component mounted on the circuit board; an image taking system which is provided in an applying or printing machine for applying or printing a high-viscosity fluid such as adhesive and creamed solder onto a circuit board and which is configured to take an image of the fluid applied or printed on the circuit board; and an image taking system which is provided in an application or printing inspection machine for inspecting a state of application or printing of a high-viscosity fluid on a printing board and which is configured to take an image of the high-viscosity fluid applied or printed on the printing board. Further, the claimable invention is applicable not only to the image taking system provided in a board working machine (such as the above-described electronic-circuit-component mounting machine, mounting inspection machine, applying or printing machine and application or printing inspection machine) which is configured to execute an operation or operations onto the circuit board, but also to an image taking system provided for any machine other than the board working machine.

What is claimed is:

1. An image taking system comprising:
an image sensor including a plurality of unit cells provided in an image taking area of said image sensor, each of said unit cells being configured to perform a photoelectric conversion;
an interest-region setter configured to set a plurality of regions of interest within said image taking area;
an acquiring-condition determiner configured to determine at least two image-data acquiring conditions required for acquiring respective at least two image data generated in respective at least two of said plurality of regions of interest that are set by said interest-region setter; and
an image-data acquirer configured to acquire the at least two image data, by the respective at least two image-data acquiring conditions that are determined by said acquiring-condition determiner, wherein
said acquiring-condition determiner includes an exposure-time determining portion configured to determine, as the at least two image-data acquiring conditions, at least two exposure times required for acquiring the respective at least two image data generated in the respective at least two of said plurality of regions of interest, such that the determined at least two exposure times are different from each other,
said image-data acquirer includes an exposure-time-based-image-data acquiring portion configured to acquire the at least two image data generated in the respective at least two of said plurality of regions of interest, such that the acquired at least two image data are based on the respective at least two exposure times that are different from each other, and
at least one of (i) the setting of said plurality of regions of interest by said interest-region setter and (ii) the determination of the at least two image-data acquiring conditions by said acquiring-condition determiner, is executed before said image-data acquirer acquires the at least two image data.

2. The image taking system according to claim 1, wherein said image sensor is a CMOS image sensor including complementary metal oxide semiconductors that constitute said unit cells.

3. The image taking system according to claim 1,
wherein said exposure-time-based-image-data acquiring portion of said image-data acquirer includes:
a plural-exposure-operations executing portion configured to execute a plurality of exposure operations for said image sensor, for thereby causing, as an image data which consists of each of the at least two image data, resultant outputs to be generated in a corresponding one of said at least two of said plurality of regions of interest as results of executions of said plurality of exposure operations;
an output receiving portion configured to receive at least one of the resultant outputs supplied from each of said at least two of said plurality of regions of interest, whereby the acquired image data that is generated in each of said at least two of said plurality of regions of interest is based on a corresponding one of the at least two exposure times which is based on a sum of said at least one of the resultant outputs supplied from said each of said at least two of said plurality of regions of interest; and
an output supply controlling portion configured to control supply of the resultant outputs from each of said at least two of said plurality of regions of interest, such that at least one of the resultant outputs, which is generated in at least one of said at least two of said plurality of regions of interest as a result of execution of a corresponding at least one of said plurality of exposure operations, is supplied to said output receiving portion, without supply of at least one of the resultant outputs, which is generated in the other of said at least two of said plurality of regions of interest as a result of execution of said corresponding at least one of said plurality of exposure operations, to said output receiving portion.

4. The image taking system according to claim 1,
wherein said exposure-time-based-image-data acquiring portion of said image-data acquirer includes:
a plural-exposure-operations executing portion configured to execute a plurality of exposure operations for said image sensor, for thereby causing, as an image data which consists of each of the at least two image data, resultant outputs to be generated in a corresponding one of said at least two of said plurality of regions of interest as results of executions of said plurality of exposure operations;
an output receiving portion configured to receive at least one of the resultant outputs supplied from each of said at least two of said plurality of regions of interest, whereby the acquired image data that is generated in each of said at least two of said plurality of regions of interest is based on a corresponding one of the at least two exposure times which is based on a sum of said at least one of the resultant outputs supplied from said each of said at least two of said plurality of regions of interest; and
an output supply controlling portion configured to control supply of the resultant outputs from each of said at least two of said plurality of regions of interest, such that at least one of the resultant outputs, which is generated in at least one of said at least two of said plurality of regions of interest as a result of execution of a corresponding at least one of said plurality of exposure operations, is supplied to said output receiving portion, together with supply of at least one of the resultant outputs, which is generated in the other of said at least two of said plurality of regions of interest as a result of execution of said corresponding at least one of said plurality of exposure operations, to said output receiving portion.

5. The image taking system according to claim 1, comprising a data storage configured to prestore therein position data indicative of positions of said plurality of regions of interest within said image taking region,
wherein said interest-region setter is configured to set said plurality of regions of interest, based on said position data that is supplied from said data storage.

6. The image taking system according to claim 1, wherein said at least one of (i) the setting of said plurality of regions of interest by said interest-region setter and (ii) the determination of the at least two image-data acquiring conditions by said acquiring-condition determiner, is executed without being based on any image data.

7. An image taking system comprising:
an image sensor including a plurality of unit cells provided in an image taking area of said image sensor, each of said unit cells being configured to perform a photoelectric conversion;
an interest-region setter configured to set a plurality of regions of interest within said image taking area;
an acquiring-condition determiner configured to determine at least two image-data acquiring conditions required for acquiring respective at least two image data generated in respective at least two of said plurality of regions of interest that are set by said interest-region setter; and
an image-data acquirer configured to acquire the at least two image data, by the respective at least two image-data acquiring conditions that are determined by said acquiring-condition determiner, wherein
said acquiring-condition determiner includes an exposure-time determining portion configured to determine, as the at least two image-data acquiring conditions, at least two exposure times required for acquiring the respective at least two image data generated in the respective at least two of said plurality of regions of interest, such that the determined at least two exposure times are different from each other,
said image-data acquirer includes an exposure-time-based-image-data acquiring portion configured to acquire the at least two image data generated in the respective at least two of said plurality of regions of interest, such that the acquired at least two image data are based on the respective at least two exposure times that are different from each other,
said exposure-time-based-image-data acquiring portion of said image-data acquirer includes:
a plural-exposure-operations executing portion configured to execute a plurality of exposure operations for said image sensor, for thereby causing, as an image data which consists of each of the at least two image data, resultant outputs to be generated in a corresponding one of said at least two of said plurality of regions of interest as results of executions of said plurality of exposure operations; and
an output-adding-operation executing portion configured to execute an output adding operation for adding the resultant outputs generated in each of said at least two of said plurality of regions of interest as results of executions of said plurality of exposure operations, such that the acquired image data that is generated in each of said at least two of said plurality of regions of interest is based on the added resultant outputs that correspond to a corresponding one of the at least two exposure times, and
said output-adding-operation executing portion configured to execute the output adding operation for adding the resultant outputs generated in each of said at least two of said plurality of regions of interest, such that the resultant outputs generated in each one of said at least two of said plurality of regions of interest are added to each other in a manner different from a manner in which the resultant outputs generated in the other of said at least two of said plurality of regions of interest are added to each other, whereby the acquired at least two image data are based on the respective at least two exposure times that are different from each other.

8. The image taking system according to claim 7, wherein said output-adding-operation executing portion is configured to obtain, as the added resultant outputs, a sum of products of the resultant outputs and respective coefficients, by executing the output adding operation, such that at least one of the resultant outputs, which is generated in each one of said at least two of said plurality of regions of interest as a result of execution of a corresponding at least one of said plurality of exposure operations, and at least one of the resultant outputs, which is generated in the other of said at least two of said plurality of regions of interest as a result of execution of said corresponding at least one of said plurality of exposure operations, are multiplied by the respective coefficients that are different from each other.

9. The image taking system according to claim 8, wherein said output-adding-operation executing portion is configured to obtain the sum of the products of the resultant outputs and the respective coefficients, such that each of at least one of the resultant outputs generated in at least one of said at least two of said plurality of regions of interest is multiplied by a corresponding one of the coefficients which is other than one.

10. The image taking system according to claim 8, wherein said output-adding-operation executing portion is configured to obtain the sum of the products of the resultant outputs and the respective coefficients, such that each of at least one of the resultant outputs generated in at least one of said at least two of said plurality of regions of interest is multiplied by a corresponding one of the coefficients which is other than one and other than zero.

11. The image taking system according to claim 7, wherein said output-adding-operation executing portion is configured to execute the output adding operation for adding the resultant outputs generated in each of said at least two of said plurality of regions of interest, after each of said resultant outputs generated in said each of said at least two of said plurality of regions of interest has been converted into a gradation value.

12. The image taking system according to claim 7, wherein said plural-exposure-operations executing portion of said exposure-time-based-image-data acquiring portion of said image-data acquirer is configured to execute said plurality of exposure operations such that at least two of said plurality of exposure operations are executed for respective lengths of time which are different from each other.

13. The image taking system according to claim 7, wherein said plural-exposure-operations executing portion of said exposure-time-based-image-data acquiring portion of said image-data acquirer is configured to execute at least two exposure operations as said plurality of exposure operations, such that one of said at least two exposure operations is executed for a length of time equal to a smallest one of said at least two different exposure times, and such that each of the other of said at least two exposure operations is executed for a length of time equal to a difference between a corresponding pair of said at least two different exposure times, the corresponding pair of said at least two different exposure times being adjacent to each other where said at least two different exposure times are arranged in order of length thereof.

14. An electronic-circuit-component mounting machine comprising:
a board holder configured to hold a circuit board;
a component mounter configured to mount a plurality of electronic circuit components onto the circuit board that is held by said board holder;
a component supplier configured to supply the electronic circuit components to said component mounter, whereby each of the electronic circuit components is received by a component holder of said component mounter;

a component-image taking system configured to take an image of each of the electronic circuit components which is held by said component holder; and a component mounting controller configured to detect a positional error of each of the electronic circuit components which is held by said component holder, based on the image taken by said component-image taking system, and to control said component mounter such that each of the electronic circuit components is mounted onto the circuit board with the positional error being at least reduced, wherein said component-image taking system is provided by the component-image taking system that is recited in claim 1.

15. The electronic-circuit-component mounting machine according to claim 14, further comprising:

an information storage configured to store therein an image-taking-related information that is required to take the image of each of the electronic circuit components such that the stored image-taking-related information is associated with said each of the electronic circuit components, and wherein said image taking system is configured to take the image of each of the electronic circuit components, in accordance with the image-taking-related information which is stored in said information storage and which is associated with said each of the electronic circuit components.

16. The electronic-circuit-component mounting machine according to claim 15, wherein said information storage is configured to store therein, in addition to the image-taking-related information, a component-mounting-related information that is required to mount each of the electronic circuit components onto the circuit board such that the component-mounting-related information as well as the image-taking-related information is associated with said each of the electronic circuit components, and wherein said component mounting controller is configured to control said component mounter such that said each of the electronic circuit components is mounted onto the circuit board, in accordance with the component-mounting-related information which is stored in said information storage and which is associated with said each of the electronic circuit components.

17. The electronic-circuit-component mounting machine according to claim 15, wherein each of at least one of said interest-region setter and said acquiring-condition determiner includes an image-taking-related-information-based executing portion that is configured to execute a corresponding one of setting of said plurality of regions of interest and determination of said image-data acquiring condition, based on the image-taking-related information that is stored in said information storage.

18. The electronic-circuit-component mounting machine according to claim 17, wherein said information storage is configured to store therein the image-taking-related information such that the stored image-taking-related information includes an interest-region setting data that is required for setting said plurality of regions of interest within said image taking area.

19. The electronic-circuit-component mounting machine according to claim 17, wherein said information storage is configured to store therein the image-taking-related information such that the stored image-taking-related information includes an image-data acquiring condition data representing the at least two image-data acquiring conditions for acquiring the at least two image data generated in the respective at least two of said plurality of regions of interest.

20. The electronic-circuit-component mounting machine according to claim 14, wherein said component mounter includes (i) a mounting head having a plurality of component-holder holding portions each of which is configured to hold said component holder, and (ii) a head moving device configured to move said mounting head such that said mounting head is positionable in any desired position within a movement area between said component supplier and said board holder, wherein said image taking area of said image sensor has a size that enables images of the plurality of electronic circuit components each of which is held by said component holder, to be formed, together with each other, on said image taking area, upon light reception by each of said unit cells provided in said image taking area, and wherein said interest-region setter is configured to set, as said plurality of regions of interest, a plurality of corresponding regions of said image taking area which correspond to respective electronic circuit components cooperating with each other to constitute at least a part of said plurality of electronic circuit components each of which is held by said component holder.

* * * * *